United States Patent
Romero

(10) Patent No.: US 12,416,692 B2
(45) Date of Patent: Sep. 16, 2025

(54) STRAY FIELD IMMUNE ANGLE SENSOR

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 404 days.

(21) Appl. No.: 17/929,326

(22) Filed: Sep. 2, 2022

(65) Prior Publication Data

US 2023/0062642 A1 Mar. 2, 2023

Related U.S. Application Data

(63) Continuation-in-part of application No. 17/238,543, filed on Apr. 23, 2021, now Pat. No. 11,555,868, and a continuation-in-part of application No. 17/015,132, filed on Sep. 9, 2020, now abandoned.

(51) Int. Cl.
*G01R 33/07* (2006.01)
(52) U.S. Cl.
CPC .................. *G01R 33/077* (2013.01)
(58) Field of Classification Search
CPC .................. G01R 33/077
See application file for complete search history.

(56) References Cited

U.S. PATENT DOCUMENTS

| | | | |
|---|---|---|---|
| 6,288,533 | B1 | 9/2001 | Haeberli et al. |
| 9,488,461 | B2 | 11/2016 | Honda et al. |
| 9,797,746 | B2 | 10/2017 | Vuillermet et al. |
| 10,782,152 | B2 | 9/2020 | Vuillermet et al. |
| 10,866,117 | B2 | 12/2020 | Kozomora et al. |
| 10,917,092 | B2 | 2/2021 | Romero |
| 11,163,019 | B1 | 11/2021 | Chaware et al. |
| 11,262,422 | B2 | 3/2022 | Romero et al. |
| 11,385,075 | B2 | 7/2022 | Foletto et al. |

(Continued)

FOREIGN PATENT DOCUMENTS

| | | |
|---|---|---|
| DE | 10320057 | 12/2004 |
| DE | 102019124371 B3 | 2/2021 |

(Continued)

OTHER PUBLICATIONS

European Intention to Grant (with Allowed Specification) dated May 2, 2024 for European Application No. EP22168908.6; 37 Pages.

(Continued)

*Primary Examiner* — Reena Aurora
(74) *Attorney, Agent, or Firm* — Daly, Crowley, Mofford & Durkee, LLP

(57) ABSTRACT

A sensor, comprising: a substrate having a reference crystal orientation and a plurality of vertical Hall element pairs that are formed on the substrate. Each vertical Hall element pair includes: (i) a respective first vertical Hall element that is oriented at a respective first angle relative to the reference crystal orientation of the substrate and (ii) a respective second vertical Hall element that is oriented at a respective second angle relative to the reference crystal orientation of the substrate. The substrate has a rectangular shape, and each of the vertical Hall element pairs is disposed in a different respective corner of the substrate.

24 Claims, 29 Drawing Sheets

(56) References Cited

U.S. PATENT DOCUMENTS

| | | | |
|---|---|---|---|
| 11,555,868 B2 | 1/2023 | Romero et al. | |
| 11,561,112 B2 | 1/2023 | Briano et al. | |
| 11,733,024 B2 | 8/2023 | Cesaretti et al. | |
| 2006/0028204 A1* | 2/2006 | Oohira | G01D 5/145 324/207.25 |
| 2015/0022186 A1 | 1/2015 | Ausserlechner | |
| 2015/0142376 A1 | 5/2015 | Ausserlechner | |
| 2017/0052038 A1* | 2/2017 | Aichriedler | G01D 5/145 |
| 2017/0248445 A1 | 8/2017 | Ausserlechner | |
| 2018/0340986 A1 | 11/2018 | Latham et al. | |
| 2020/0088546 A1 | 3/2020 | Sirohiwala et al. | |
| 2021/0011097 A1 | 1/2021 | David et al. | |
| 2021/0055129 A1 | 2/2021 | Kozomora et al. | |
| 2021/0072016 A1 | 3/2021 | Kollmitzer et al. | |
| 2021/0156664 A1 | 5/2021 | Binder et al. | |
| 2021/0262777 A1 | 8/2021 | Lassalle-Balier et al. | |
| 2022/0075008 A1 | 3/2022 | Romero | |
| 2022/0357144 A1 | 11/2022 | Tombez | |
| 2023/0003503 A1 | 1/2023 | Cesaretti et al. | |
| 2023/0025177 A1 | 1/2023 | Cesaretti et al. | |

FOREIGN PATENT DOCUMENTS

| | | | |
|---|---|---|---|
| DE | 102020214615 A1 | 5/2021 | |
| EP | 3550269 | 10/2019 | |

OTHER PUBLICATIONS

Response to European Examination Report dated Oct. 4, 2023 for European Application No. EP22168908.6; Response filed Jan. 31, 2024; 10 Pages.

Communication Pursuant to Article 94(3) EPC (with pending claims) dated Oct. 4, 2023 for European Application No. 22 168 908.6-1001; 9 Pages.

European Response to Search or Examination Procedure for European Application No. EP22168908.6; filed Apr. 21, 2023; 17 Pages.

Office Action dated Nov. 29, 2021 for U.S. Appl. No. 17/015,132; 17 pages.

Response to Office Action dated Nov. 29, 2021, filed Feb. 22, 2022 for U.S. Appl. No. 17/015,132; 14 pages.

Final Office Action dated May 2, 2022 for U.S. Appl. No. 17/015,132; 15 pages.

Response to Final Office Action dated May 2, 2022, filed Aug. 2, 2022 for U.S. Appl. No. 17/015,132; 15 pages.

Advisory Action dated Aug. 23, 2022 for U.S. Appl. No. 17/015,132; 5 pages.

Response to Final Office Action dated Nov. 29, 2021, filed Sep. 1, 2022 for U.S. Appl. No. 17/015,132; 14 pages.

Advisory Action dated Sep. 22, 2022 for U.S. Appl. No. 17/015,132; 3 pages.

Extended European Search Report dated Oct. 12, 2022 for European Application No. EP22168908.6; 7 pages.

Office Action dated Dec. 29, 2022 for U.S. Appl. No. 17/363,732; 9 pages.

Notice of Allowance dated May 3, 2023 for U.S. Appl. No. 17/363,732; 12 Pages.

Response to Office Action dated Dec. 29, 2023, filed Mar. 29, 2023 for U.S. Appl. No. 17/363,732; 7 Pages.

European Notice of Intention to Grant dated Sep. 6, 2024 for European Application No. EP22168908.6; 35 Pages.

* cited by examiner

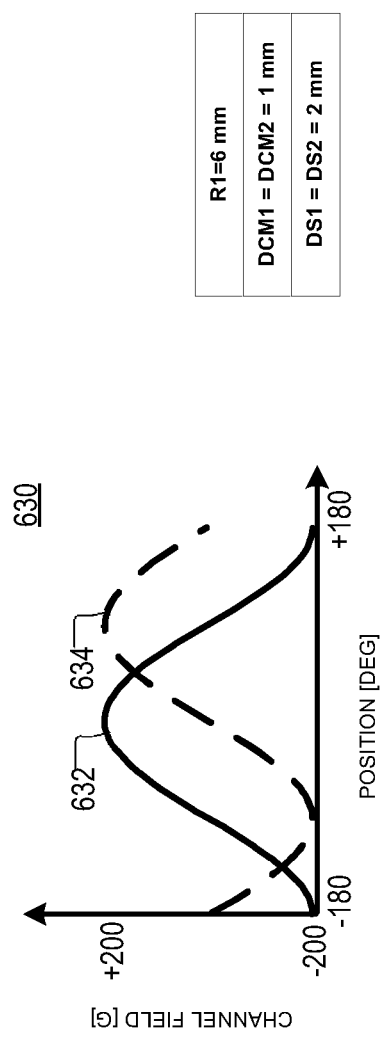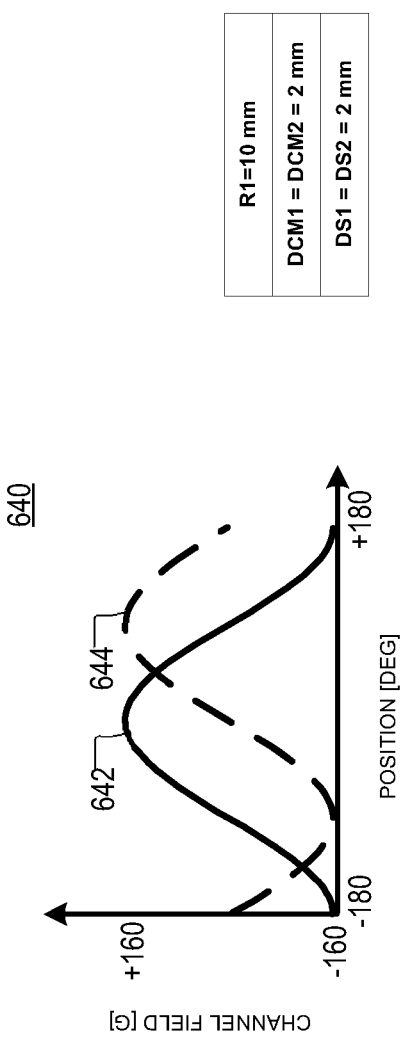

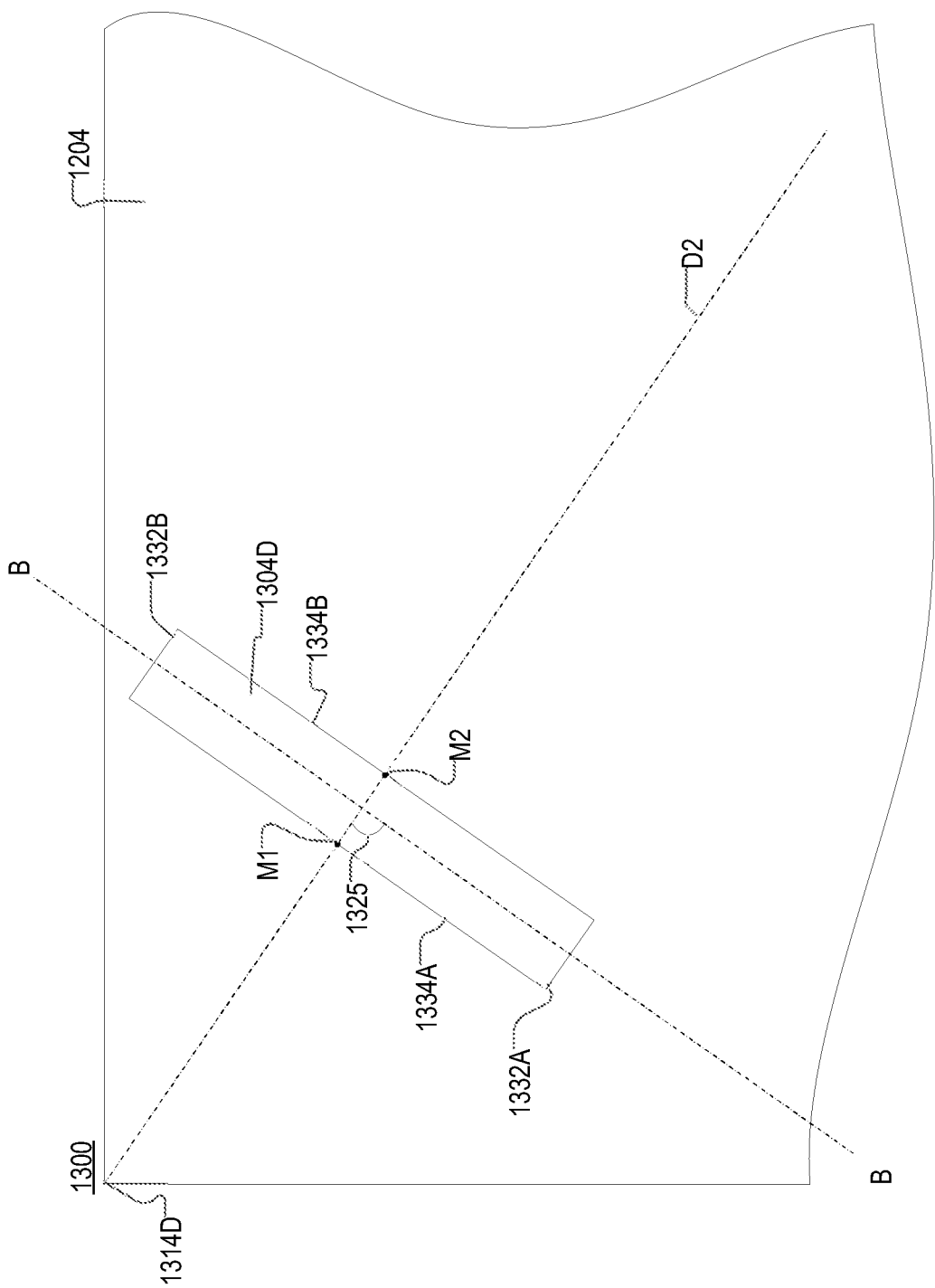

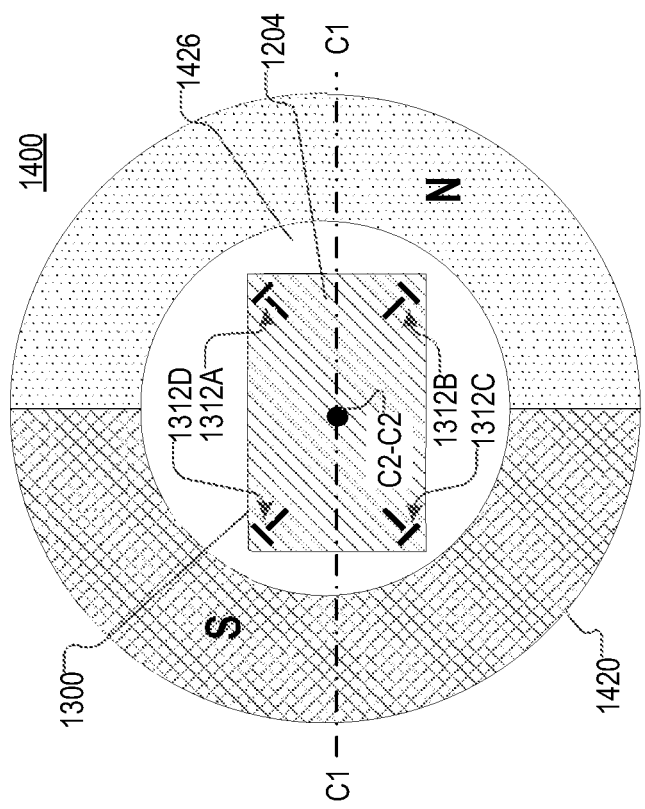
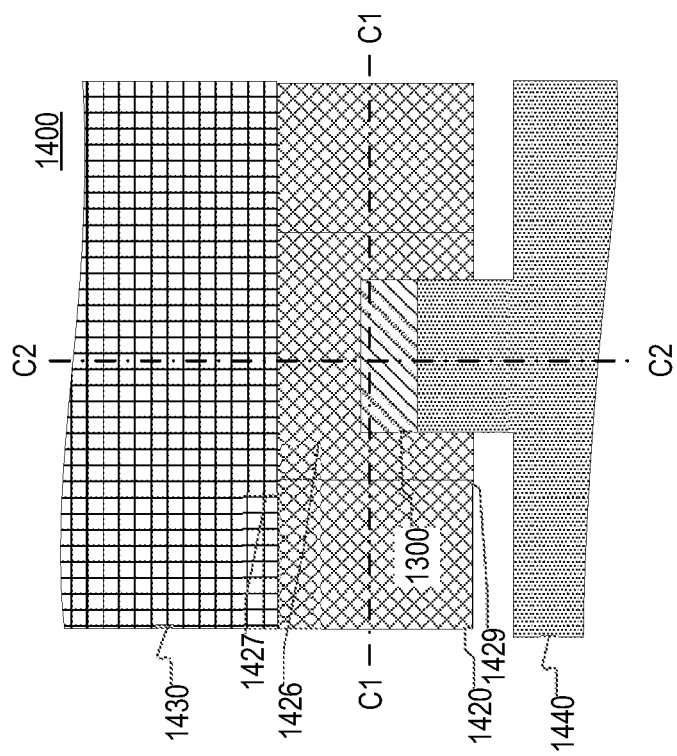
FIG. 14B
FIG. 14A

STRAY FIELD IMMUNE ANGLE SENSOR

CLAIM OF PRIORITY

The present application is filed as a Continuation-in-Part application of U.S. application Ser. No. 17/015,132, filed on Sep. 9, 2020, and entitled Stray Field Immune Angle Sensor, which is herein incorporated by reference in its entirety. The present application is also a continuation-in-part application of U.S. application Ser. No. 17/238,543, filed on Apr. 23, 2021, and entitled Electronic Circuit Having Vertical Hall Elements Arranged on a Substrate to Reduce an Orthogonality Error, which is herein incorporated by reference in its entirety.

BACKGROUND

Magnetic field sensors employ a variety of types of magnetic field sensing elements, for example, Hall effect elements and magnetoresistance elements, often coupled to a variety of electronics, all disposed over a common substrate. A magnetic field sensing element (and a magnetic field sensor) can be characterized by a variety of performance characteristics, one of which is a sensitivity, which can be expressed in terms of an output signal amplitude versus a magnetic field to which the magnetic field sensing element is exposed. Some magnetic field sensors can detect a linear motion of a target object. Some other magnetic field sensors can detect a rotation of a target object. The accuracy with which magnetic field sensors detect an intended magnetic field can be adversely affected by the presence of stray magnetic fields (i.e., fields other than those intended to be detected).

SUMMARY

According to aspects of the disclosure, a sensor is provided, comprising: a substrate having a reference crystal orientation; and a plurality of vertical Hall element pairs that are formed on the substrate, each vertical Hall element pair including: (i) a respective first vertical Hall element that is oriented at a respective first angle relative to the reference crystal orientation of the substrate and (ii) a respective second vertical Hall element that is oriented at a respective second angle relative to the reference crystal orientation of the substrate, wherein the substrate has a rectangular shape, and each of the vertical Hall element pairs is disposed in a different respective corner of the substrate.

According to aspects of the disclosure, a sensor is provided, comprising: a substrate having a rectangular shape; a plurality of vertical Hall element pairs that are formed on the substrate, each of the vertical Hall element pairs being formed in a different corner of the substrate, each of the vertical Hall element pairs including: (i) a respective first vertical Hall element that is configured to face the vertical Hall element pair's respective corner, and (ii) a respective second vertical Hall element that is configured to face away from the vertical Hall element pair's respective corner.

According to aspects of the disclosure, a system is provided, comprising: a ring magnet having first surface, a second surface, and a bore extending from the first surface to the second surface, the bore having a central longitudinal axis; a substrate having a reference crystal orientation; plurality of vertical Hall element pairs that are formed on the substrate, each vertical Hall element pair including: (i) a respective first vertical Hall element that is oriented at a respective first angle relative to the reference crystal orientation of the substrate and (ii) a respective second vertical Hall element that is oriented at a respective second angle relative to the reference crystal orientation of the substrate.

BRIEF DESCRIPTION OF THE DRAWINGS

The foregoing features may be more fully understood from the following description of the drawings in which:

FIG. 6D is a plot illustrating aspects of the operation of the system of FIG. 4A or 4B, according to aspects of the disclosure;

FIG. 6E is a plot illustrating aspects of the operation of the system of FIG. 4A or 4B, according to aspects of the disclosure;

FIG. 13C is a top-down view of a portion of the sensor of FIG. 13A, according to aspects of the disclosure;

FIG. 14A is a cross-sectional side view of a system that includes the sensor of FIG. 13A, according to aspects of the disclosure;

FIG. 14B is a cross-sectional top-down view of the system of FIG. 14A, according to aspects of the disclosure;

DETAILED DESCRIPTION

Figure 1A:
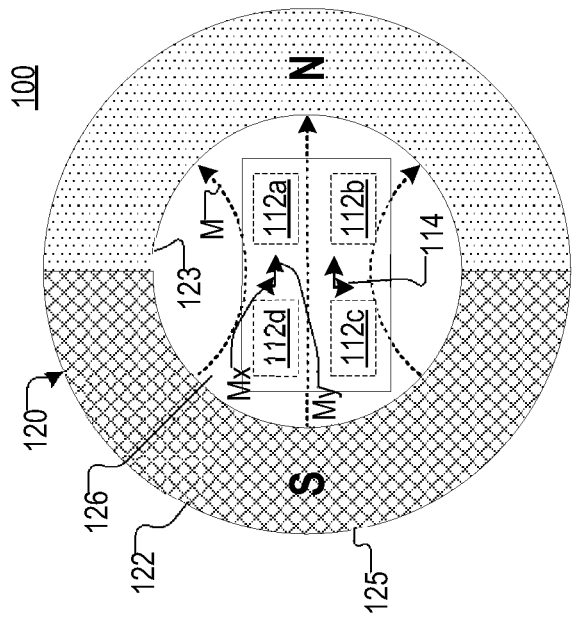
FIG. 1A is a top-down view of an example of a system that includes a sensor and a ring magnet, according to aspects of the disclosure.

FIGS. 1A-D show an example of a system 100, according to aspects of the disclosure. As illustrated, the system 100 may include a sensor 110 and a ring magnet 120. The ring magnet 120 may include a top surface 122, a bottom surface 124, and a bore 126 that extends from the top surface 122 to the bottom surface 124. The ring magnet 120 may have an inner sidewall 123 (which defines the bore 126) and outer sidewall 125. The ring magnet 120 may also have an inner radius R1, and the bore 126 of the ring magnet 120 may have a longitudinal axis B-B, as shown. The inner sidewall 123 may be symmetrical with respect to the longitudinal axis B-B (i.e., the longitudinal axis B-B can be a central longitudinal axis with the inner sidewall 123 concentric with respect to the central longitudinal axis), and the inner radius R1 may be the distance between the inner sidewall 123 and the longitudinal axis B-B.

Figure 1B:
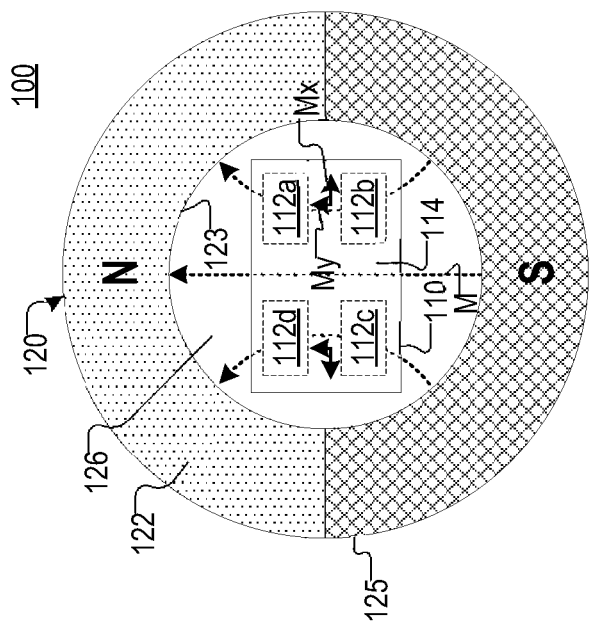
FIG. 1B is a top-down view of the system of FIG. 1A, according to aspects of the disclosure.
Figure 1C:
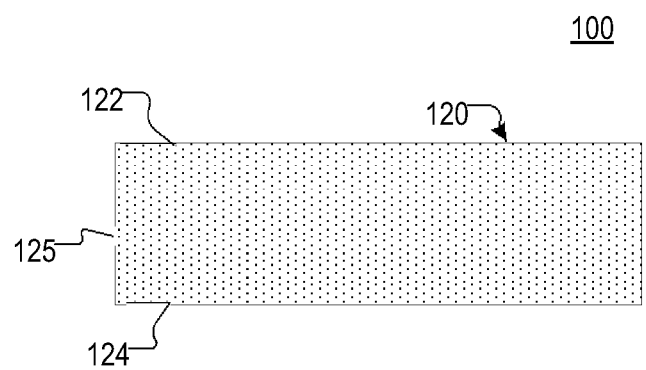
FIG. 1C is a side view of the system of FIG. 1A, according to aspects of the disclosure.
Figure 1D:
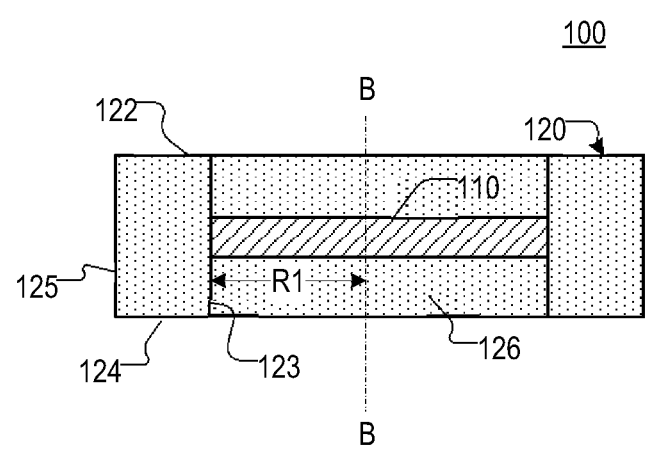
FIG. 1D is a cross-sectional side view of the system of FIG. 1A, according to aspects of the disclosure.
Figure 2:
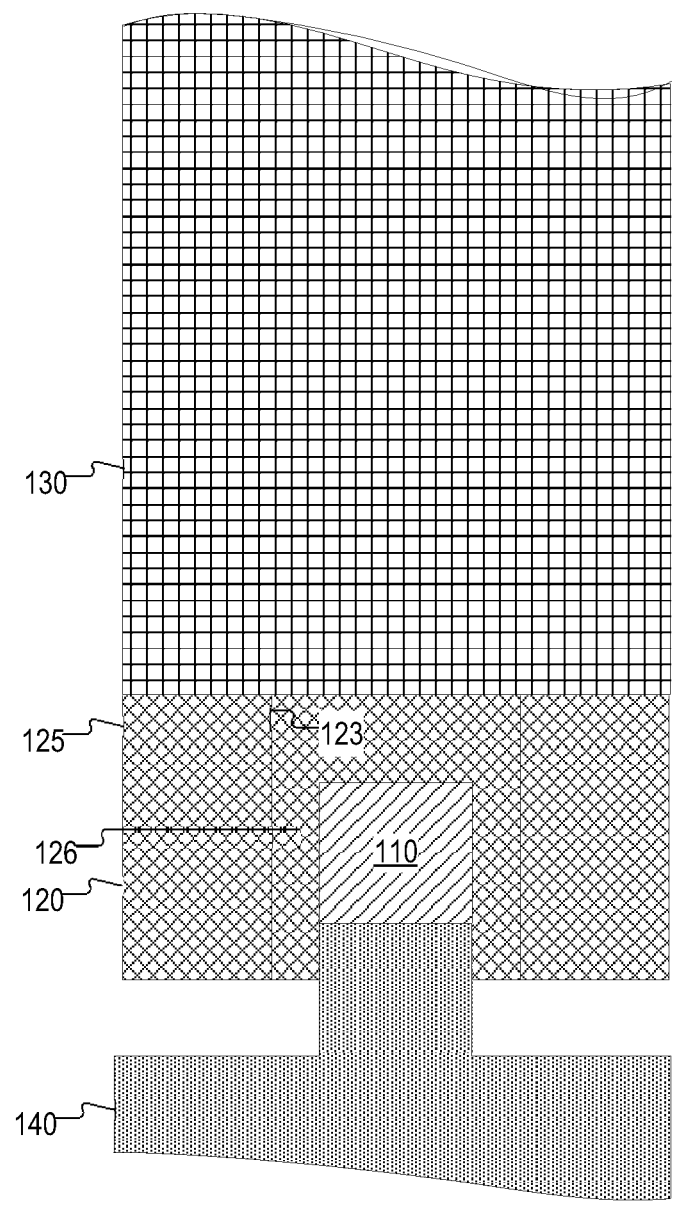
FIG. 2 is a schematic diagram illustrating the operation of the system of FIG. 1A, according to aspects of the disclosure.

The sensor 110 may be disposed inside the bore 126, and subjected to a magnetic field M (indicated by dashed arrows in FIGS. 1A-B). The sensor 110 may include groups of Hall effect elements 112 and processing circuitry that are formed on a substrate 114. As illustrated in FIG. 2, in operation, the ring magnet 120 may be coupled to a rotating shaft 130, and the sensor 110 may be provided in the form of an integrated circuit (IC) mounted on a mounting member 140. The ring magnet 120 may turn with the rotating shaft 130, while the sensor 110 may remain in a fixed position. As a result of this arrangement, the direction of the magnetic field M may change (as illustrated in FIGS. 1A-B), and this change may be reflected in the signals that are generated by each Hall element group 112. The signals that are generated by each of the Hall elements in Hall element groups 112 may be used to determine the angular position and/or speed of the rotating shaft 130 (and in some embodiments also the direction of rotation). According to the example of FIGS. 1A-E, the longitudinal axis B-B of the bore 126 is coincident with the axis of rotation of the ring magnet 120.

Hall element groups 112 may include magnetic field sensing elements that have an axis of maximum sensitivity parallel to the major, active surface (e.g., top surface 122) of the substrate supporting the elements (e.g., Hall element groups 112 may comprise vertical Hall elements) as explained further below. Consideration of FIGS. 1A and 1B reveals that as the magnet 120 rotates, the magnetic field lines through the elements likewise rotate. The X and Y components of the magnetic field M are labeled Mx and My. Considering elements in groups 112a and 112d as an example, in FIG. 1A, the y-axis component of the magnetic field My is common to both groups 112a, 112d whereas the x-axis component of the magnetic field Mx is differential (i.e., equal strength on both groups 112a, 112d but opposite polarity). When the magnet is rotated ninety degrees as shown in FIG. 1B, the x-axis component of the magnetic field Mx is common to both groups 112a, 112d whereas the y-axis component of the magnetic field My becomes differential. Thus, combining signals from groups 112a, 112d will yield a differential signal that corresponds to the field M that is desired to be detected (i.e., the field generated by the rotating magnet). Stray magnetic fields are uniform across the sensor regardless of rotational position of the ring magnet 120 and refer generally to fields other than the rotating field M generated by the ring magnet. Thus, the stray magnetic field incident on groups 112a and 112d will always be common to both groups and thus will tend to cancel when signals from groups 112a, 112d are combined or subtracted. It will be appreciated that the resulting stray field immunity is cancelled or removed by placing sensing elements that form differentially processed pairs such that the field lines M intended to be detected are incident on the differentially processed pairs of elements in the same direction.

FIGS. 3A-E show the sensor 110 in further detail. As illustrated the sensor 110 may have central axes X-X and Y-Y, which are substantially orthogonal to one another and intersect at the center CS of the substrate 114. Each of the Hall element groups 112 may include a respective vertical Hall element 312 and a respective vertical Hall element 314. Specifically, Hall element group 112a may include a vertical Hall element 312a and a vertical Hall element 314a; Hall element group 112b may include a vertical Hall element 312b and a vertical Hall element 314b; Hall element group 112c may include a vertical Hall element 312c and a vertical Hall element 314c; and Hall element group 112d may include a vertical Hall element 312d and a vertical Hall element 314d.

Vertical Hall elements are constructed from top to bottom along the depth of the substrate 114 and can be oriented to sense X, Y, or other directions parallel to a major, active surface 118 of the substrate 114 (i.e., semiconductor die) in which they are formed. Stated differently, vertical Hall elements have an axis of maximum sensitivity parallel to the major surface 118 of the substrate 114 that supports the element (in-plane fields). It will be appreciated that the side views of FIGS. 3B-E show the vertical Hall elements with an exaggerated depth for illustration purposes and that such elements generally do not extend above the major surface of the substrate. Each of the vertical Hall elements 312 may be aligned with the axis X-X, and each of the vertical Hall elements 314 may be aligned with the axis Y-Y. Accordingly, any two vertical Hall elements 312 and 314 that are part of the same Hall element group 112 may be orthogonal (i.e., arranged at a 90-degree angle) relative to one another. For example, the axes of maximum sensitivity of vertical Hall elements 312*a* and 314*a* may be at a 90-degree angle relative to one another; the axes of maximum sensitivity of vertical Hall elements 312*b* and 314*b* may be at a 90-degree angle relative to one another; the axes of maximum sensitivity of vertical Hall elements 312*c* and 314*c* may be at a 90-degree angle relative to one another; and the axes of maximum sensitivity of vertical Hall elements 312*d* and 314*d* may be at a 90-degree angle relative to one another. This arrangement allows the signals output from the vertical Hall elements in any of the Hall element groups 112 to be in quadrature with one another, which in turn allows the signals to be easily used for determining the angular position of the ring magnet 120 (and/or shaft 130) relative to the sensor 110.

In the example of FIGS. 3A-G each group 112 includes vertical Hall elements whose axes of maximum sensitivity are arranged at an angle relative to one another (e.g., 90 degrees). However, alternative implementations are possible in which each of the groups 112 is implemented by using any other suitable type of magnetic transducers whose axes of maximum sensitivity are at an angle relative to one another and substantially parallel to the main surface of the substrate. Such magnetic field sensing elements may include vertical Hall elements, giant magnetoresistors (GMR), tunnel magnetoresistors (TMR), and or any other suitable type of magnetic transducer having an axis of maximum sensitivity that may be substantially parallel with the plane of the substrate on which the magnetic transducer is formed, etc.

As used throughout the disclosure, the phrase "magnetic field sensing element is aligned with a given axis" shall be interpreted as "a magnetic field sensing element whose axis of maximum sensitivity is aligned (e.g., substantially parallel) with the given axis". FIG. 3F shows in further detail the relative positioning of each of the vertical Hall elements 312 and 314 with respect to the substrate 114. As illustrated in FIG. 3F, the vertical Hall elements 312 may be disposed on the periphery of the substrate 114. Each of the vertical Hall elements 312 may be disposed at a distance DE2 from the nearest edge of the substrate 114, and each of the vertical Hall elements 312 may be disposed at a distance DC2 from the center CS of the substrate 114, where DE2<DC2. In some implementations, the distance DE2 may be at least 90% smaller than the distance DC2. Additionally or alternatively, in some implementations, each of the vertical Hall elements 312 may be disposed at the very edge of the substrate 114, in which case the distance DE2 may be very close to zero. For instance, the vertical Hall elements 312 may be formed as close to the edge(s) of the substrate 114 as the manufacturing process used permits. Each of the vertical Hall elements 314 may be disposed at a distance DE1 from the nearest edge of the substrate 114, and each of the vertical Hall elements 314 may be disposed at a distance DC1 from the center CS of the substrate 114, where DE1<DC1. In some implementations, the distance DE1 may be at least 90% smaller than the distance DC1. Additionally or alternatively, in some implementations, each of the vertical Hall elements 312 and 314 may be disposed at the very edge of the substrate 114, in which case the distance DC1 may be close to zero. For instance, the vertical Hall elements 314 may be formed as close to the edge(s) of the substrate 114 as the manufacturing process used permits. In some respects, disposing the vertical Hall elements 312 and 314 on the periphery of the substrate 114 is advantageous because it may result in a higher amount of magnetic flux being incident on the vertical Hall elements 312 and 314 than if the elements were closer to the center of the substrate, which in turn could increase the sensitivity of the sensor 110 with respect to the position of the ring magnet 120.

According to the present example, the distance DE1 is equal to the distance DE2. However, alternative implementations are possible in which the distance DE1 is different from the distance DE2. According to the present example, the distance DC1 is equal to the distance DC2. However, alternative implementations are possible in which the distance DC1 is different from the distance DC2.

Although in the example of FIG. 3F each of the vertical Hall elements 312 is spaced by the same distance from the edge of the substrate that is nearest to the vertical Hall element 312, alternative implementations are possible in which any two of the vertical Hall elements 312 are spaced by different distances from the respective edges of the substrate 114 that are closest to the two vertical Hall elements. Although in the example of FIG. 3F each of the vertical Hall elements 314 is spaced by the same distance from the edge of the substrate that is nearest to the vertical Hall element 314, alternative implementations are possible in which any two of the vertical Hall elements 314 are spaced by different distances from the respective edges of the substrate 114 that are closest to the two vertical Hall elements.

Figure 3A:
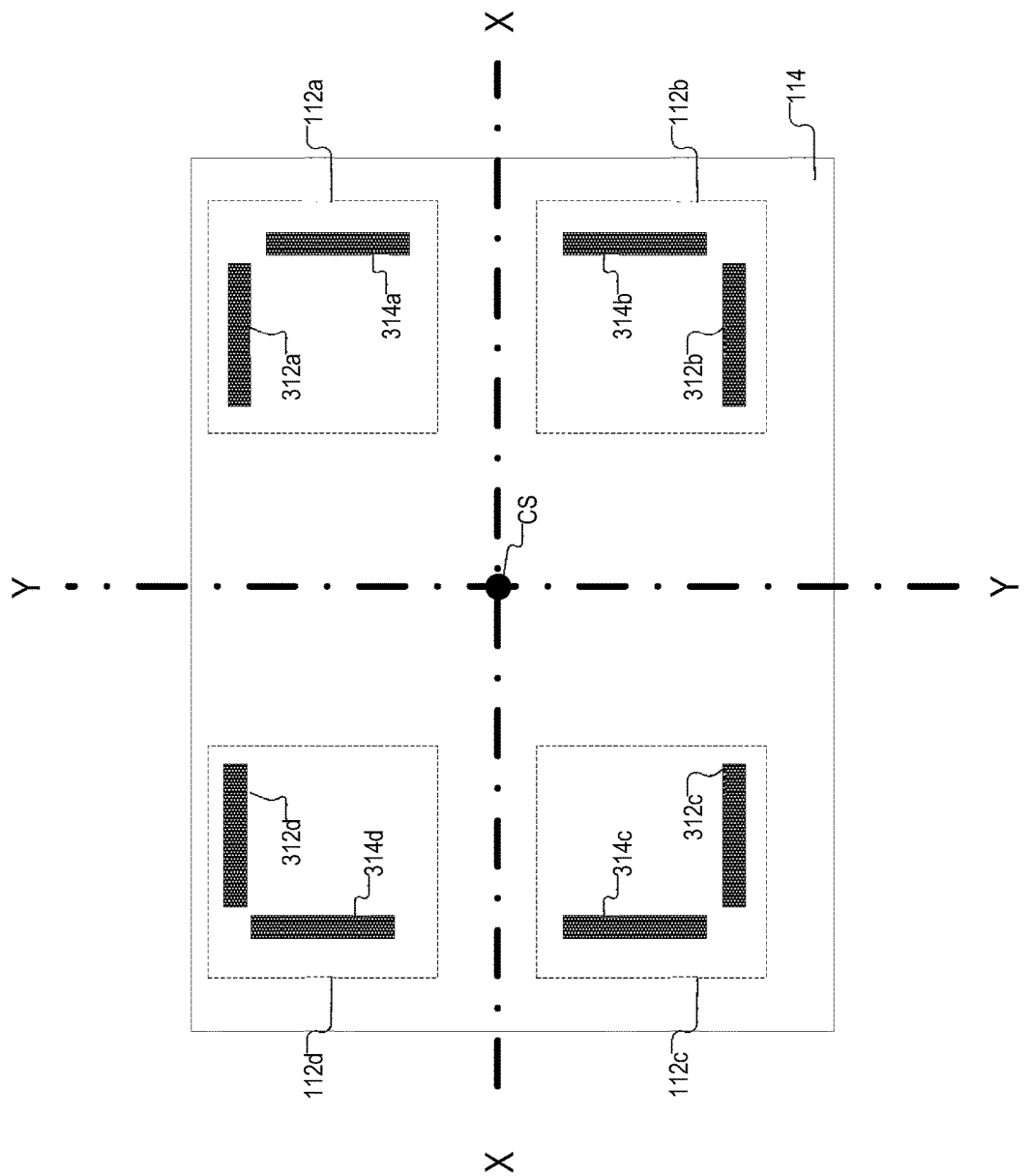
FIG. 3A is a top-down view of the sensor that is part of the system of FIG. 1A, according to aspects of the disclosure.
Figure 3C:
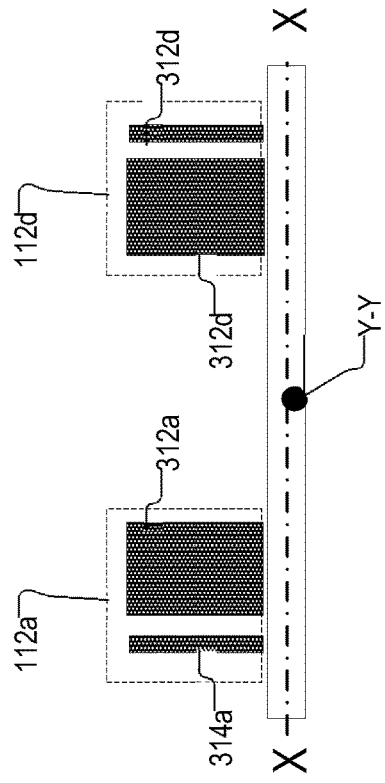
FIG. 3C is a side view of the sensor of FIG. 3A, according to aspects of the disclosure.
Figure 3B:
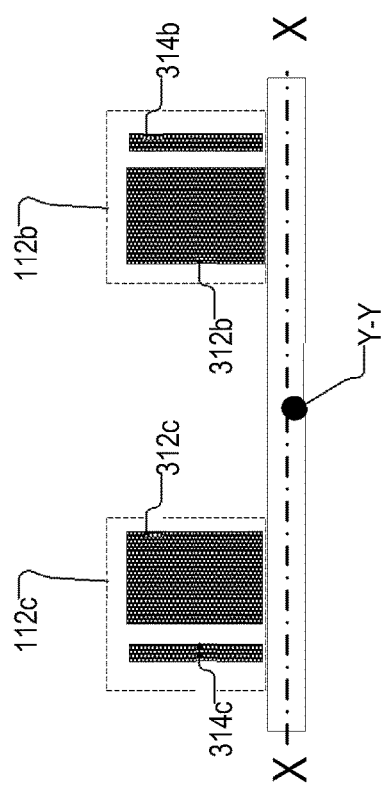
FIG. 3B is a side view of the sensor of FIG. 3A, according to aspects of the disclosure.
Figure 3E:
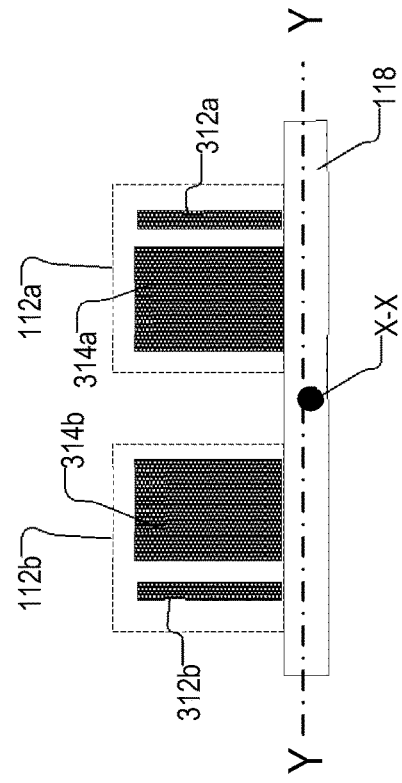
FIG. 3E is a side view of the sensor of FIG. 3A, according to aspects of the disclosure.
Figure 3D:
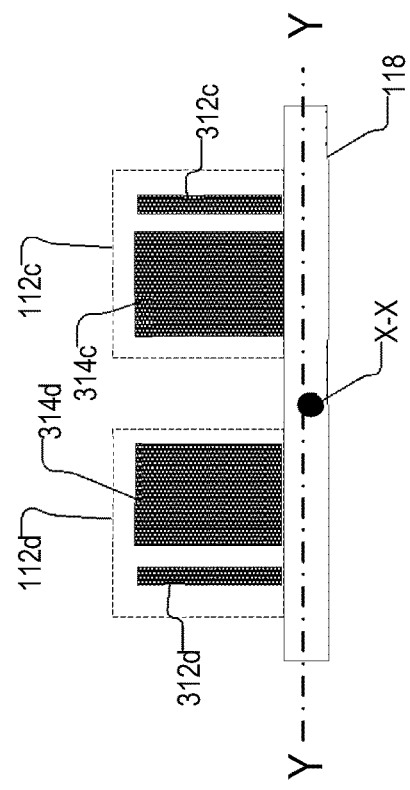
FIG. 3D is a side view of the sensor of FIG. 3A, according to aspects of the disclosure.
Figure 3F:
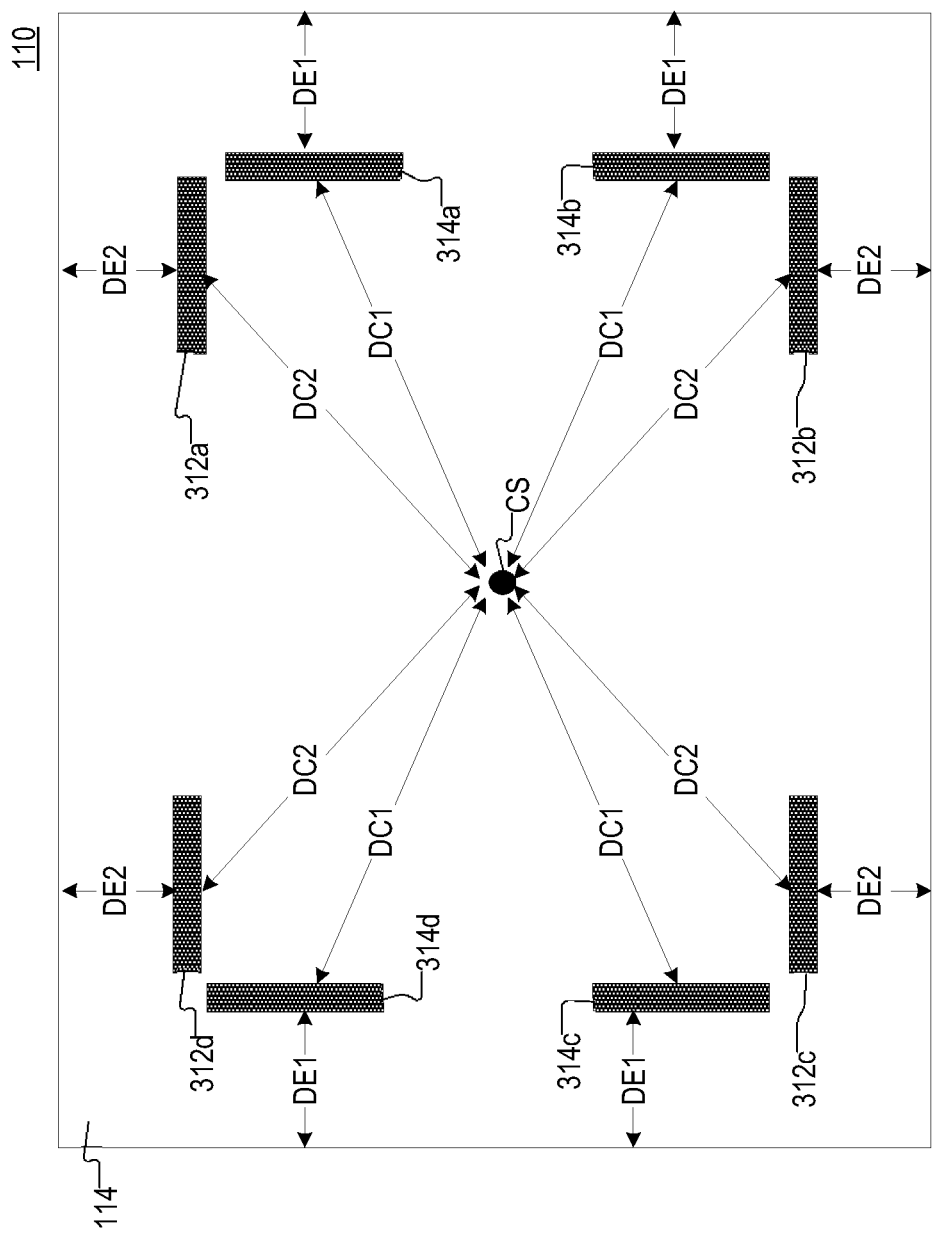
FIG. 3F is a top-down view of the sensor of FIG. 3A, according to aspects of the disclosure.
Figure 3G:
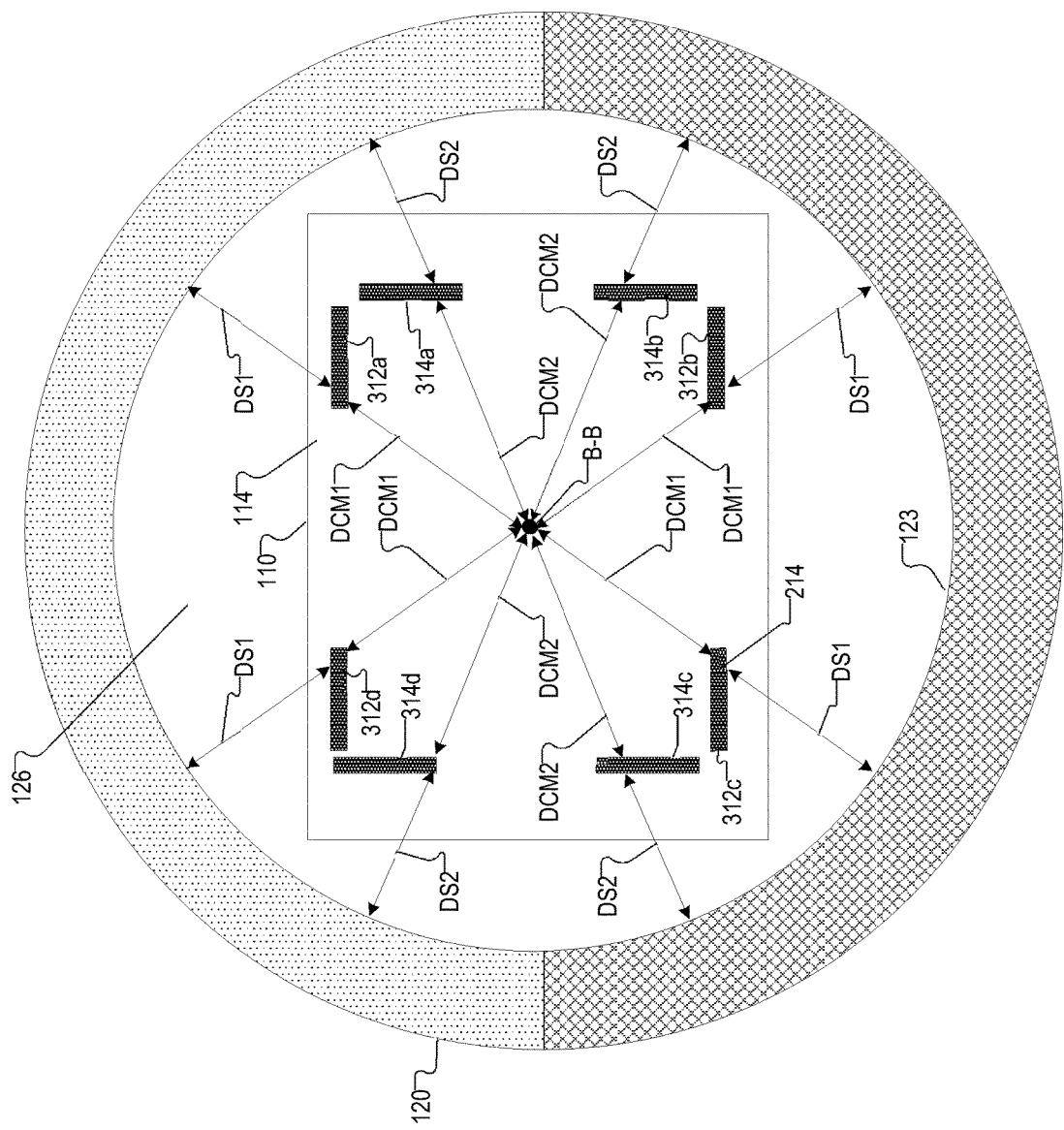
FIG. 3G is a top-down view of the sensor of FIG. 3A with the ring magnet of the system of FIG. 1A, according to aspects of the disclosure.

FIG. 3G shows in further detail the relative positioning of each of the vertical Hall elements 312 and 314 with respect to the ring magnet 120 when the sensor 110 is installed in the bore 126 of the ring magnet 126. As illustrated, each vertical Hall element 312 may be positioned at a distance DCM1 from the longitudinal axis B-B of the bore 126 of the ring magnet 120 and each vertical Hall element 314 may be positioned at a distance DCM2 from the longitudinal axis B-B of the bore 126 of the ring magnet 120. Furthermore, each of the vertical Hall elements 312 may be positioned at a distance DS1 from the inner sidewall 123 of the ring magnet 120, and each of the vertical Hall elements 314 may be positioned at a distance DS2 from the inner sidewall 123 of the ring magnet 120.

According to the present example, the distance DS1 is equal to the distance DS2. However, alternative implementations are possible in which the distance DS1 is different from the distance DS2. According to the present example, the distance DCM1 is equal to the distance DCM2. However, alternative implementations are possible in which the distance DCM1 is different from the distance DCM2. Although in the example of FIG. 3G each of the vertical Hall elements 312 is spaced by the same distance from the inner sidewall 123 of the ring magnet 120, alternative implementations are possible in which any two of the vertical Hall elements 312 are spaced by a different distance from the inner sidewall 123 of the ring magnet 120. Although in the example of FIG. 3G each of the vertical Hall elements 312 is spaced by the same distance from the longitudinal axis B-B of the bore 126 of the ring magnet 120, alternative implementations are possible in which any two of the vertical Hall elements 312 are spaced by a different distance from the longitudinal axis B-B of the bore 126 of the ring magnet 120. Although in the example of FIG. 3G each of the vertical Hall elements 314 is spaced by the same distance from the inner sidewall 123 of the ring magnet 120, alternative implementations are possible in which any two of the vertical Hall elements 314 are spaced by a different distance from the inner sidewall 123 of the ring magnet 120. Although in the example of FIG. 3G each of the vertical Hall elements 314 is spaced by the same distance from the longitudinal axis B-B of the bore 126 of the ring magnet 120, alternative implementations are possible in which any two of the vertical Hall elements 314 are spaced by a different distance from the longitudinal axis B-B of the bore 126 of the ring magnet 120.

Figure 4A:
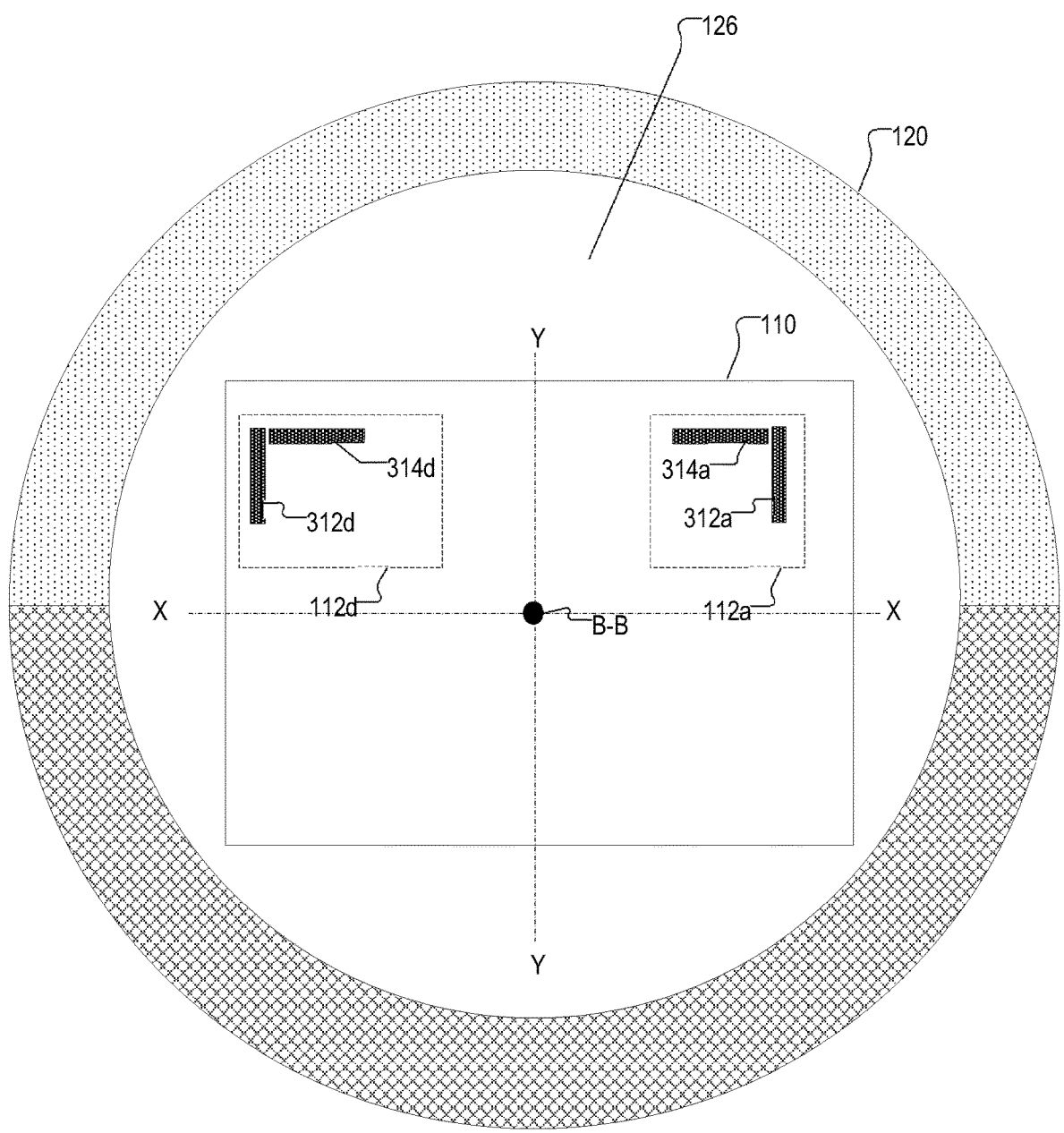
FIG. 4A is a top-down view of a system including a ring magnet and a sensor, according to aspects of the disclosure.

FIG. 4A shows the sensor 110 in accordance with another implementation. In this implementation, the sensor 110 includes only Hall element groups 112a and 112d. As illustrated, in implementations in which the sensor 110 includes only two groups of vertical Hall elements, both groups of vertical Hall elements may be disposed on the substrate 114 in an arrangement that is asymmetrical with respect to the longitudinal axis B-B of the bore 126 of the ring magnet 120. Hall element groups 112a and 112d are also in an arrangement that is asymmetrical with respect to axis X-X, but symmetrical with respect to axis Y-Y, as shown. Specifically, both groups of vertical Hall elements may be disposed adjacent to the same edge 110a of the substrate 114 (rather than being diagonally-opposed). With this configuration, rotation of the ring magnet 120 will result in incident magnetic field line variations of the same general type described above in connection with FIGS. 1A-B, thereby achieving stray field immunity. Although there can be a cost and space advantage to using only the two groups of vertical Hall elements as shown in FIG. 4A, using all four groups 112a, 112b, 112c, 112d (FIG. 1) can provide a more symmetrical configuration According to aspects of the disclosure, positioning both pairs of sensing elements on the same side of the bore 126, as shown—in FIG. 4A, is advantageous because it allows the sensor 110 to get fully differential signals from elements 312a-312d and 314a-314d respectively. If these two pairs were placed in diagonally opposed directions then no differential signals could be generated in any of the two pairs, and therefore stray field cancellation would not be possible. As can be readily appreciated, both pairs sensing elements can be on one side of the substrate as shown in FIG. 4A, above or both below the X-X axis, or alternatively both sensing element pairs can be positioned on the left or right of the Y-Y axis.

In some respects, having four Hall element groups 112 in the sensor 110 is advantageous because it may provide another degree of symmetry and help increase immunity to second order effects, like mechanical stresses or on-die thermal gradients. Having, two groups 112 of vertical Hall element groups 112 however is advantageous because it could help decrease the size and/or cost of manufacturing the sensor 110, while maintaining more than adequate immunity to second order effects.

The four groups are better to increase immunity to second order effects like: mechanical stresses or on-die thermal gradients: having two pairs may only partially cancel those gradients, while having four pairs provides another degree of symmetry and therefore should cancel most gradients.

In the embodiment of FIG. 4A, similar to the embodiment of FIG. 3A, the vertical Hall elements are positioned at or near the periphery of the substrate to achieve a higher level of incident magnetic flux achieved by having the elements proximate to the magnet. It will be appreciated that the effect of increased magnetic flux achieved by positioning the elements near or along the periphery of the substrate (i.e., rather than nearer to the center of the substrate) can be enhanced by reducing the inner diameter of the ring magnet, both achieving the result of positioning the transducers closer to the magnet. Another way to achieve this increased magnetic flux incident on the sensing elements is by displacing the substrate with respect to the longitudinal bore of the magnet as shown in FIG. 4B.

Figure 4B:
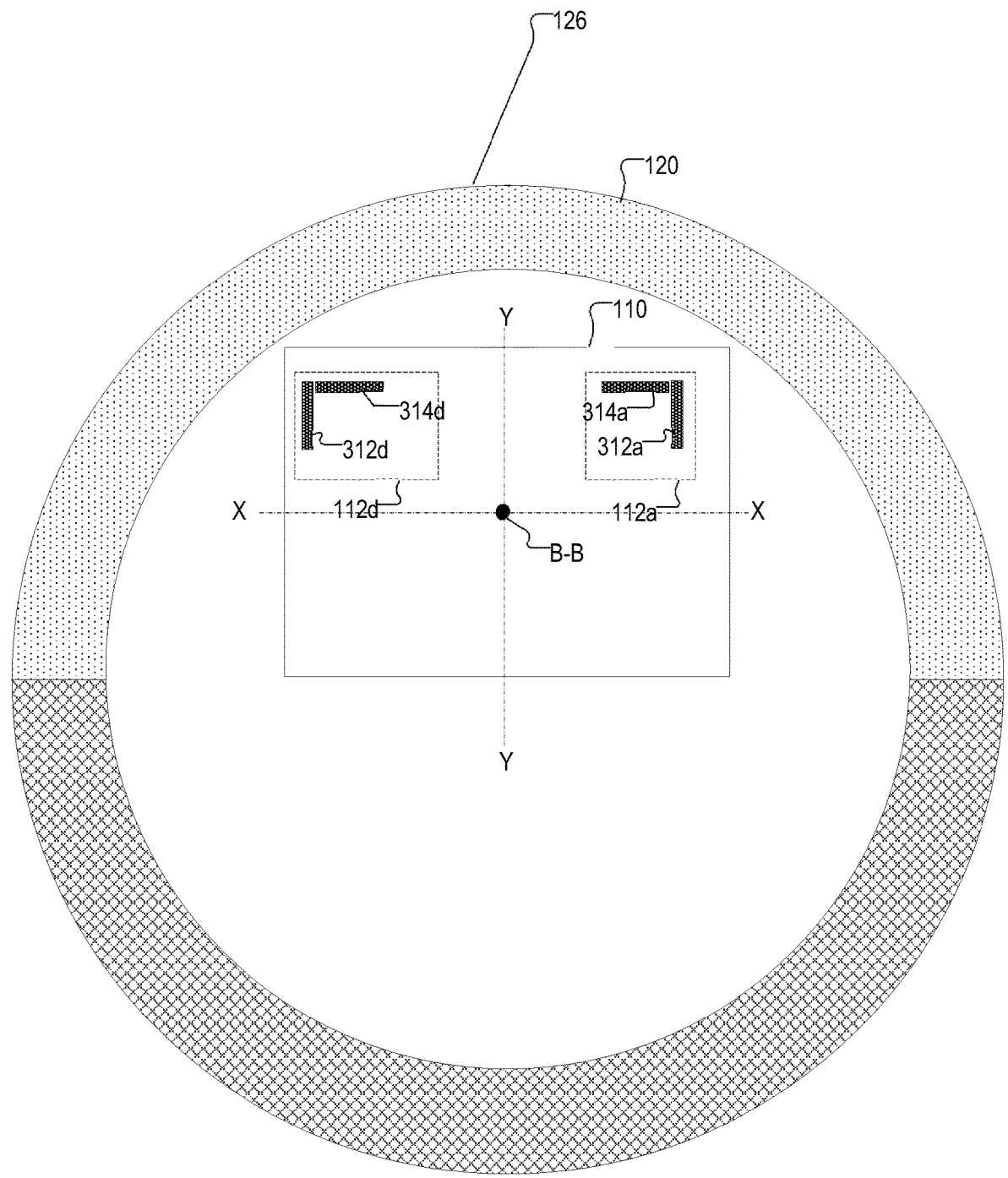
FIG. 4B is a top-down view of another system including a ring magnet and a sensor, according to aspects of the disclosure.
Figure 5:
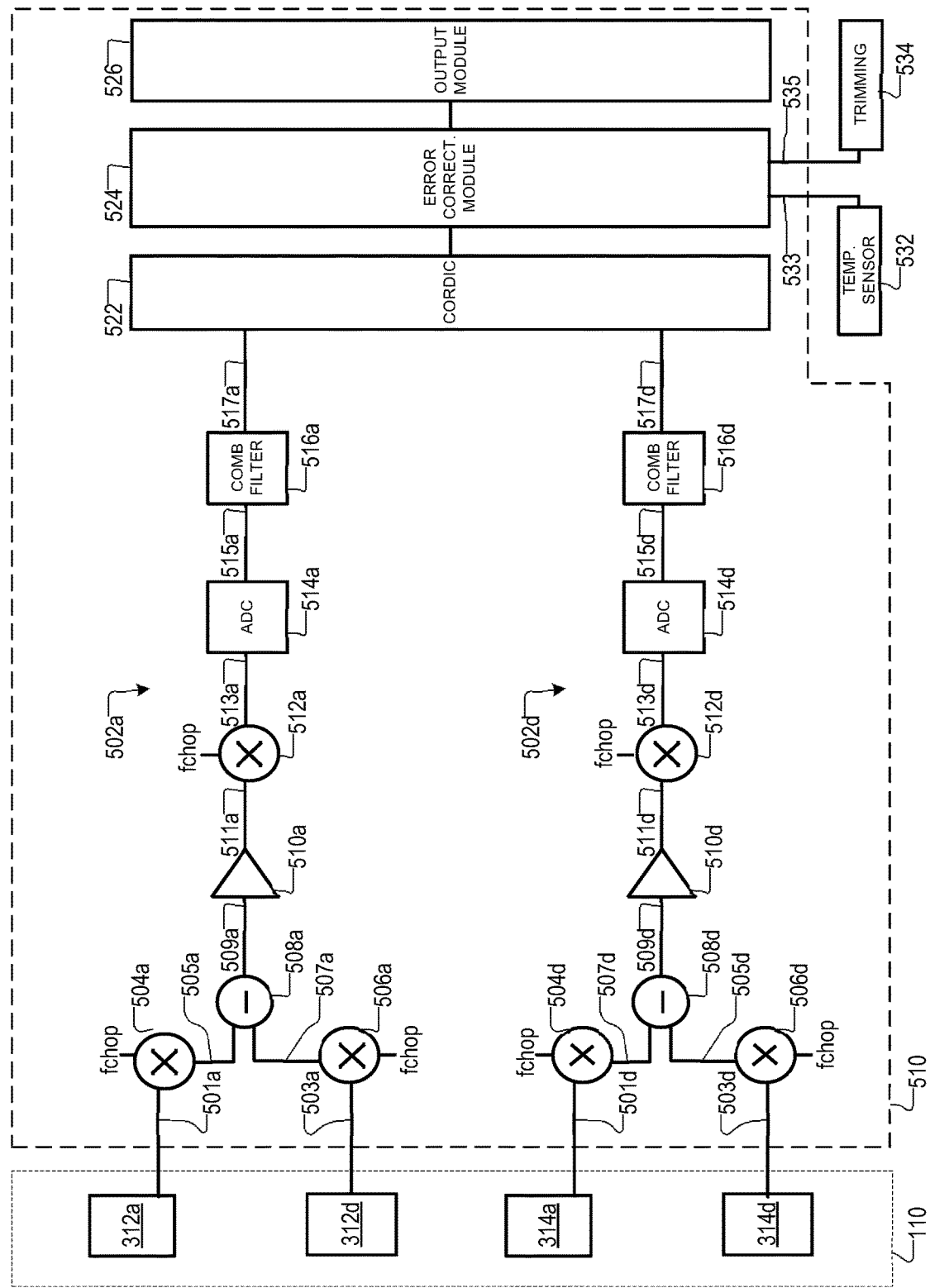
FIG. 5 is a circuit diagram of the system of FIG. 4A or 4B, according to aspects of the disclosure.

FIG. 5 is a circuit diagram of a processing circuitry 510 that is used in conjunction with the implementation of the sensor 110 which is shown in FIG. 4A or 4B. The processing circuitry 510 may include a processing path 502a and a processing path 502d. The processing path 502a may be arranged to process signals that are generated by the vertical Hall elements 312a and 312d and the processing path 502d may be arranged to process signals that are generated by the vertical Hall elements 314a and 314d.

The vertical Hall element 312a may generate a signal 501a that is subsequently provided to a modulator 504a. The modulator 504a may modulate the signal 501a based on a frequency fchop to produce a modulated signal 505a. The vertical Hall element 312d may generate a signal 503a that is subsequently provided to a modulator 506a. The modulator 506a may modulate the signal 503a based on the frequency fchop to produce modulated signal 507a. A subtractor 508a may subtract the modulated signal 507a from the modulated signal 505a to produce a differential signal 509a, which is subsequently provided to an amplifier 510a. As can be readily appreciated from the discussion above, subtracting the two signals from one another may cancel out the effects of stray magnetic fields that are incident on the vertical Hall elements 312a and 312d, resulting in signal 509a being immune to stray field effects. The amplifier 510a may amplify the signal 509a to produce an amplified signal 511a, which is subsequently provided to a demodulator 512a. The demodulator 512a may demodulate the amplified signal 511a based on the frequency fchop to produce a demodulated signal 513a, which is subsequently provided to an analog-to-digital converter (ADC) 514a. The ADC 514a may digitize the demodulated signal 513a to produce a digital signal 515a, which is subsequently provided to a filter 516a, as may be a comb filter in embodiments. The filter 516a may filter the digital signal 515a to produce a filtered signal 517a, which is subsequently provided to a CORDIC module 522.

The vertical Hall element 314a may generate a signal 501d that is subsequently provided to a modulator 504a. The modulator 504d may modulate the signal 501d based on a frequency fchop to produce a modulated signal 505a. The vertical Hall element 314d may generate a signal 503d that is subsequently provided to a modulator 506a. The modulator 506d may modulate the signal 503d based on the frequency fchop to produce modulated signal 507a. A subtractor 508d may subtract the modulated signal 507d from the modulated signal 505d to produce a signal 509d, which is subsequently provided to an amplifier 510a. As can be readily appreciated from the discussion above, subtracting the two signals from one another may cancel out the effects of stray magnetic fields that are incident on the vertical Hall elements 314a and 314d, resulting ins signal 509d being immune to stray field effects. The amplifier 510d may amplify the signal 509d to produce an amplified signal 511a, which is subsequently provided to a demodulator 512a. The demodulator 512d may demodulate the amplified signal 511d based on the frequency fchop to produce a demodulated signal 513a, which is subsequently provided to an analog-to-digital converter (ADC) 514a. The ADC 514d may digitize the demodulated signal 513d to produce a digital signal 515a, which is subsequently provided to a comb filter 516a. The comb filter 516d may filter the digital signal 515d to produce a filtered signal 517a, which is subsequently provided to a CORDIC module 522.

The CORDIC module 522 may include any suitable type of processing circuitry that is configured to execute a Coordinate Rotation Digital Computer (CORDIC) algorithm or otherwise compute an arctangent function (e.g., such as by using a look-up table). According to the example of FIG. 5, the CORDIC module is configured to calculate a raw position signal based on the filtered signal $517a$ and the filtered signal $517d$. The raw position signal may identify the orientation of the ring magnet 120 relative to the sensor 110, and it may be indicative of angular displacement and/or rotational speed of the ring magnet 120 (and/or the rotating shaft 130). In some implementations, the raw position signal may be calculated in accordance with Equation 1 below:

$$S_{raw} = \arctan\left(\frac{signal_{517a}}{signal_{517d}}\right) \quad \text{(Eq. 1)}$$

where $S_{raw}$ is the raw position signal, $signal_{517a}$ is signal $517a$, and $signal_{571d}$ is signal $517d$.

The error correction module 524 may include any suitable type of processing circuitry for adjusting the gain and/or offset of the raw position signal that is produced by the CORDIC module 522. In operation, the error correction module 524 may receive the raw position signal from the CORDIC module 522 and generate an adjusted signal based on the received raw position signal. The adjusted signal may be generated by adjusting the gain and/or offset of the raw position signal. The gain and/or offset of the raw position signal may be adjusted, in a well-known fashion, based on a signal 533 that is generated by a temperature sensor 532. Additionally or alternatively, the gain and/or offset of the raw position signal may be adjusted based on a signal 535 that is generated by a trim module 534. The trim module 534 may be a memory that is arranged to provide (to the error correction module) one or more coefficients for adjusting the gain and/or offset of the raw position signal. However, alternative implementations are possible in which the trim module 534 includes another type of device (e.g., a humidity sensor, etc.) that is used for correcting the gain and/or offset of the raw position signal. Stated succinctly, the present disclosure is not limited to any specific method for adjusting the gain and/or offset of the raw position signal.

The output module 526 may include any suitable type of communications interface for outputting the adjusted signal that is produced by the error correction module 524. The output block may format the adjusted signal into a desired output signal format and provide the formatted signal to another device (e.g., an Engine Control Unit) that is coupled to the output module 526. The desired format may be PWM format, Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format to name a few non-limiting examples.

FIG. 5 is provided in the context of the implementation of the sensor 110 that is shown in FIG. 4B, in which the sensor 110 is provided with two pairs of sensing elements. In the example of FIG. 5, the signal $S_{raw}$ is generated by taking the arctan of the quotient of signals $517a$ and $517d$, where signals $517a$ and $517d$ are generated in accordance with equations 2 and 3 below:

$$signal_{517a} = signal_{312a} - signal_{312d} \quad (2)$$

$$signal_{517d} = signal_{314a} - signal_{314d} \quad (3)$$

where $signal_{312a}$ is the signal output from sensing element $312a$ (also referred to as signal $501a$ in FIG. 5), $signal_{312d}$ is the signal output from sensing element $312d$ (also referred to as signal $503a$ in FIG. 5), $signal_{314a}$ is the signal output from sensing element $314a$ (also referred to as signal $501d$ in FIG. 5), and $signal_{314d}$ is the signal output from sensing element $314d$ (also referred to as signal $503d$ in FIG. 5).

In the implementation shown in FIG. 3G, in which the sensor 110 is provided with four pairs of sensing elements, the signals $517a$ and $517d$ may be generated in accordance with equations 4 and 5 below:

$$signal_{517a} = (signal_{312a} + signal_{312c}) - (signal_{312d} + signal_{312b}) \quad (4)$$

$$signal_{517d} = (signal_{314a} + signal_{314c}) - (signal_{314d} + signal_{314b}) \quad (5)$$

where $signal_{312a}$ is the signal output from sensing element $312a$, $signal_{312b}$ is the signal output from sensing element $312b$, $signal_{312c}$ is the signal output from sensing element $312c$, $signal_{312d}$ is the signal output from sensing element $312d$, $signal_{314a}$ is the signal output from sensing element $314a$, $signal_{314b}$ is the signal output from sensing element $314b$, $signal_{314c}$ is the signal output from sensing element $314c$, $signal_{314d}$ is the signal output from sensing element $314d$. The signals $517a$ and $517d$, which are generated in accordance with equations 4 and 5, may be used to generate a signal Sraw, as discussed above with respect to Equation 1. As can be readily appreciated, equations 2-5 are provided for illustrative purposes only, and they do not reflect demodulation, amplification, filtering, and/or any other signal processing that might take place.

Figure 6A:
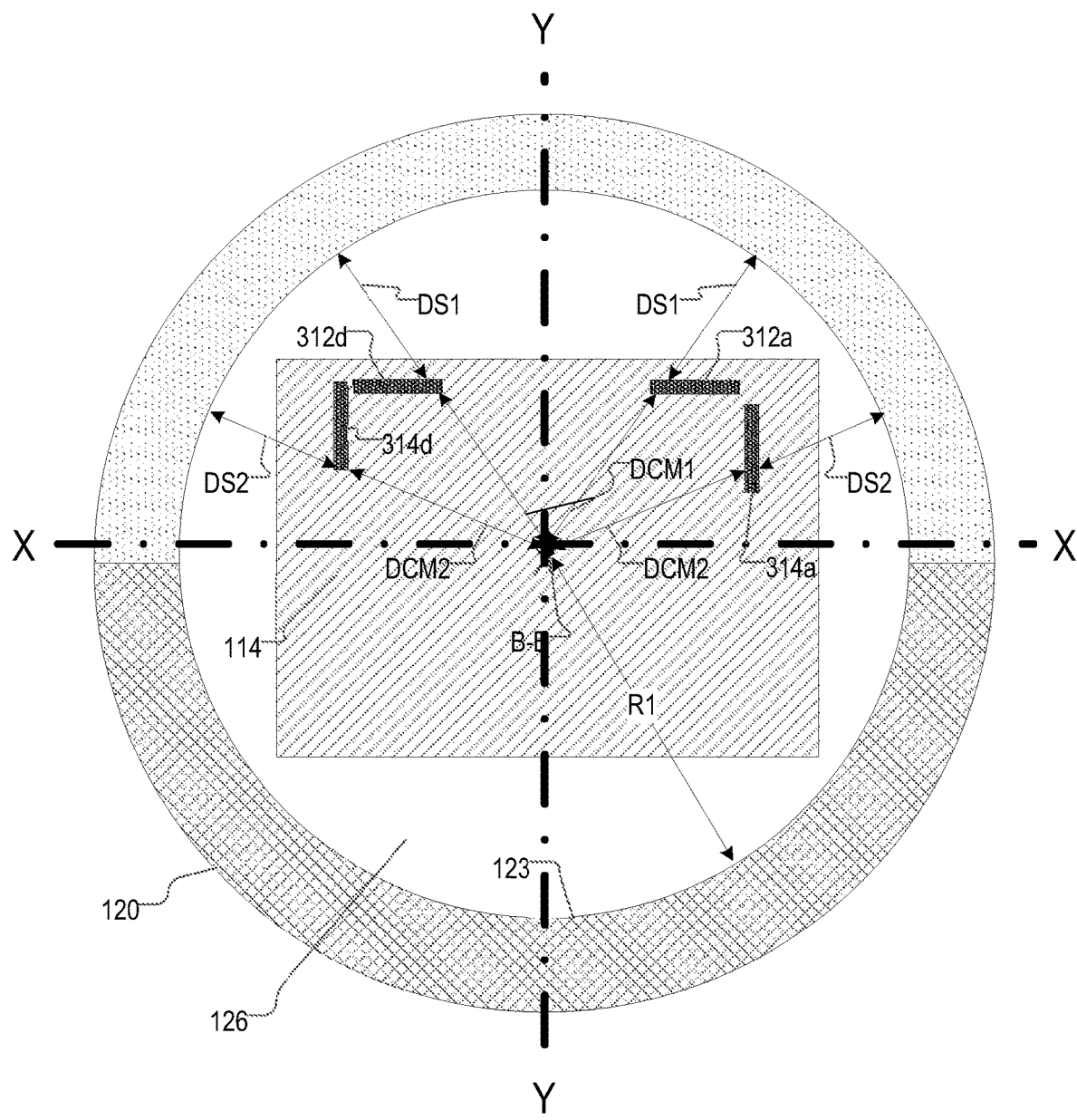
FIG. 6A is a top-down view of the system of FIG. 4A or 4B, according to aspects of the disclosure.

FIG. 6A illustrates in further detail the impact of three parameters of the sensor 110 on the operation of the sensor 110. The parameters include: (i) the inner radius R1 of the ring magnet, the distance DCM1 between each of the vertical Hall elements $312a$ and $312d$ and the longitudinal axis B-B of the bore 126 of the ring magnet 120, (ii) the distance DCM2, between each of the vertical Hall elements $314a$ and $314d$ and the longitudinal axis B-B of the bore 126 of the ring magnet 120, (iii) the distance DS1 between each of the vertical Hall elements $312a$ and $312d$ and the inner sidewall 123 of the ring magnet 120, and (iv) the distance DS2 between each of the vertical Hall elements $314a$ and $314d$ and the inner sidewall 123 of the ring magnet 120.

Figure 6B:
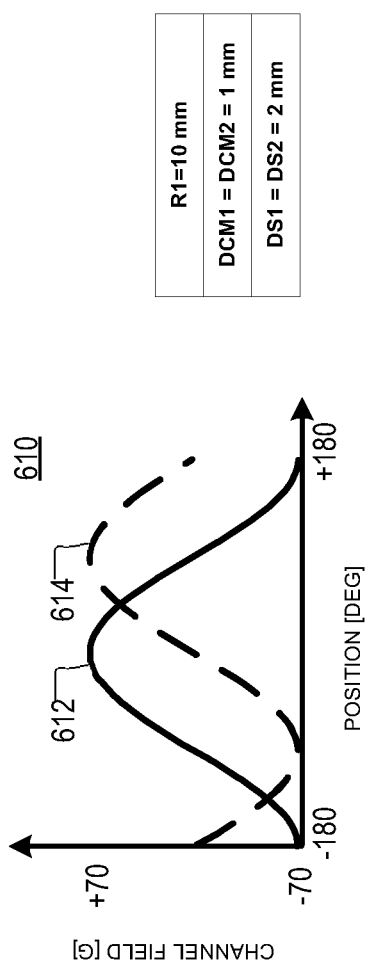
FIG. 6B is a plot illustrating aspects of the operation of the system of FIG. 4A or 4B, according to aspects of the disclosure.

FIG. 6B is a plot 610 of curves 612 and 614. Curve 612 represents the magnetic field strength that would be sensed by the sensor 110 along axis X-X (i.e., represents the magnetic field signal sensed by x-axis oriented element $314a$ or $314d$) when R1 is set to 10 mm, DCM1 and DCM2 are both set to 1 mm, and DS1 and DS2 are both set to 2 mm. Curve 614 represents the magnetic field strength that would be sensed by the sensor 110 along axis Y-Y (i.e., represents the magnetic field signal sensed by y-axis oriented element $312a$ or $312d$) when R1 is set to 10 mm, DCM1 and DCM2 are both set to 1 mm, and DS1 and DS2 are both set to 2 mm. Together, curves 612 and 614 illustrate that the measured strength of magnetic field M would vary between +70G and −70G when R1 is set to 10 mm, DCM1 and DCM2 are both set to 1 mm, and DS1 and DS2 are both set to 2 mm.

Figure 6C:
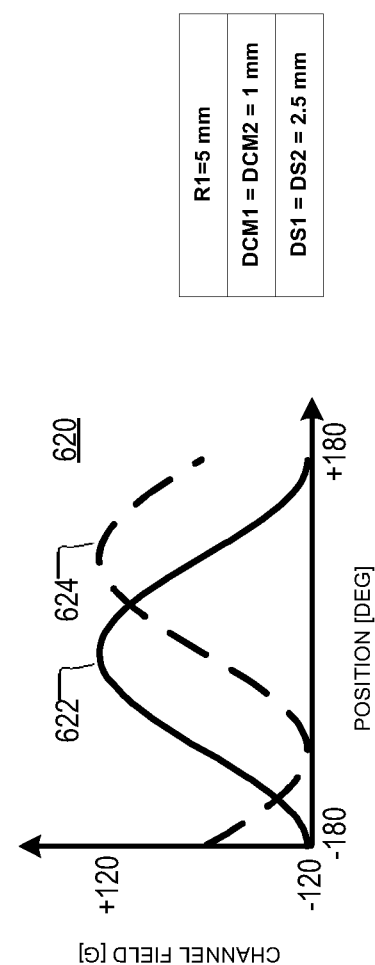
FIG. 6C is a plot illustrating aspects of the operation of the system of FIG. 4A or 4B, according to aspects of the disclosure.

FIG. 6C is a plot 620 of curves 622 and 624. Curve 622 represents the magnetic field strength that would be sensed by the sensor 110 along axis X-X (i.e., represents the magnetic field signal sensed by x-axis oriented element $314a$ or $314d$) when R1 is set to 10 mm, DCM1 and DCM2 are both set to 1 mm, and DS1 and DS2 are both set to 2.5 mm. Curve 624 represents the magnetic field strength that would be sensed by the sensor 110 along axis Y-Y (i.e., represents the magnetic field signal sensed by y-axis oriented element 312a or 312d) when R1 is set to 10 mm, DCM1 and DCM2 are both set to 1 mm, and DS1 and DS2 are both set to 2.5 mm. Together, curves 622 and 624 illustrate that the measured strength of magnetic field M would vary between +120G and −120G when R1 is set to 10 mm, DCM1 and DCM2 are both set to 1 mm, and DS1 and DS2 are both set to 2.5 mm.

FIG. 6D is a plot 630 of curves 632 and 634. Curve 632 represents the magnetic field strength that would be sensed by the sensor 110 along axis X-X (i.e., represents the magnetic field signal sensed by x-axis oriented element 314a or 314d) when R1 is set to 6 mm, DCM1 and DCM2 are both set to 1 mm, and DS1 and DS2 are both set to 2 mm. Curve 634 represents the magnetic field strength that would be sensed by the sensor 110 along axis Y-Y (i.e., represents the magnetic field signal sensed by y-axis oriented element 312a or 312d) when R1 is set to 6 mm, DCM1 and DCM2 are both set to 1 mm, and DS1 and DS2 are both set to 2 mm. Together, curves 632 and 634 illustrate that the measured strength of magnetic field M would vary between +200G and −200G when R1 is set to 6 mm, DCM1 and DCM2 are both set to 1 mm, and DS1 and DS2 are both set to 2 mm.

FIG. 6E is a plot 640 of curves 642 and 644. Curve 642 represents the magnetic field strength that would be sensed by the sensor 110 along axis X-X (i.e., represents the magnetic field signal sensed by x-axis oriented element 314a or 314d) when R1 is set to 5 mm, DCM1 and DCM2 are both set to 1 mm, and DS1 and DS2 are both set to 2 mm. Curve 644 represents the magnetic field strength that would be sensed by the sensor 110 along axis Y-Y (i.e., represents the magnetic field signal sensed by y-axis oriented element 312a or 312d when R1 is set to 5 mm, DCM1 and DCM2 are both set to 2 mm, and DS1 and DS2 are both set to 2 mm. Together, curves 642 and 644 illustrate that the measured strength of magnetic field M would vary between +160G and −160G when R1 is set to 10 mm, DCM1 and DCM2 are both set to 2 mm, and DS1 and DS2 are both set to 2 mm.

In some respects, FIGS. 6B-E illustrate that the closer the elements are symmetrically in place to the inner sidewall 123 of the ring magnet 120, the larger the magnetic field strength that would be incident on the sensor 110. According to the present disclosure, it has been found that the distance between the inner sidewall 123 of the ring magnet 120 and any of the vertical Hall elements 312a, 312d, 314a, and 314d of at most 2 mm is desirable in order to obtain acceptable magnetic field levels. Furthermore, FIGS. 6B-E further illustrate that reducing the inner radius R1 of the ring magnet 120 may have a similar effect to increasing the magnetic flux density that is incident on the sensor 110.

Figure 7B:
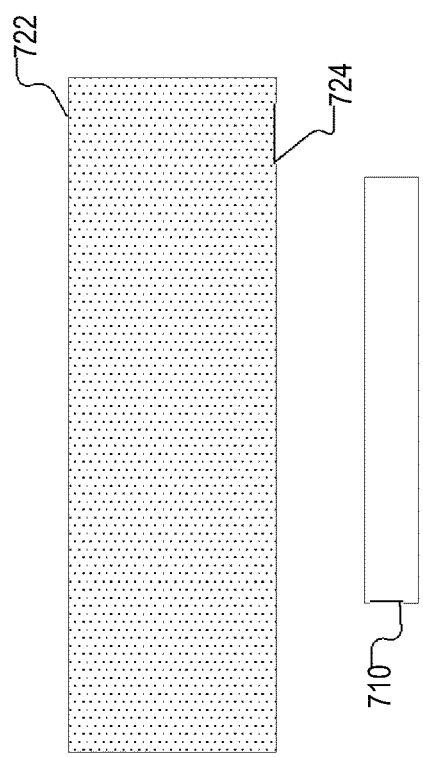
FIG. 7B is side view of an example of a system including a magnet and a sensor, according to aspects of the disclosure.
Figure 7A:
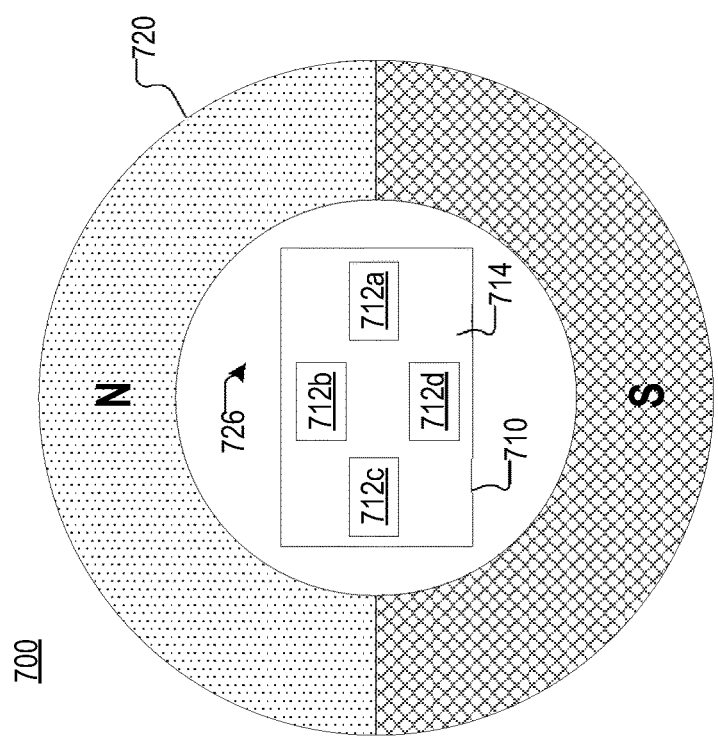
FIG. 7A is top-down view of an example of a system including a magnet and a sensor, according to aspects of the disclosure.
Figure 7C:
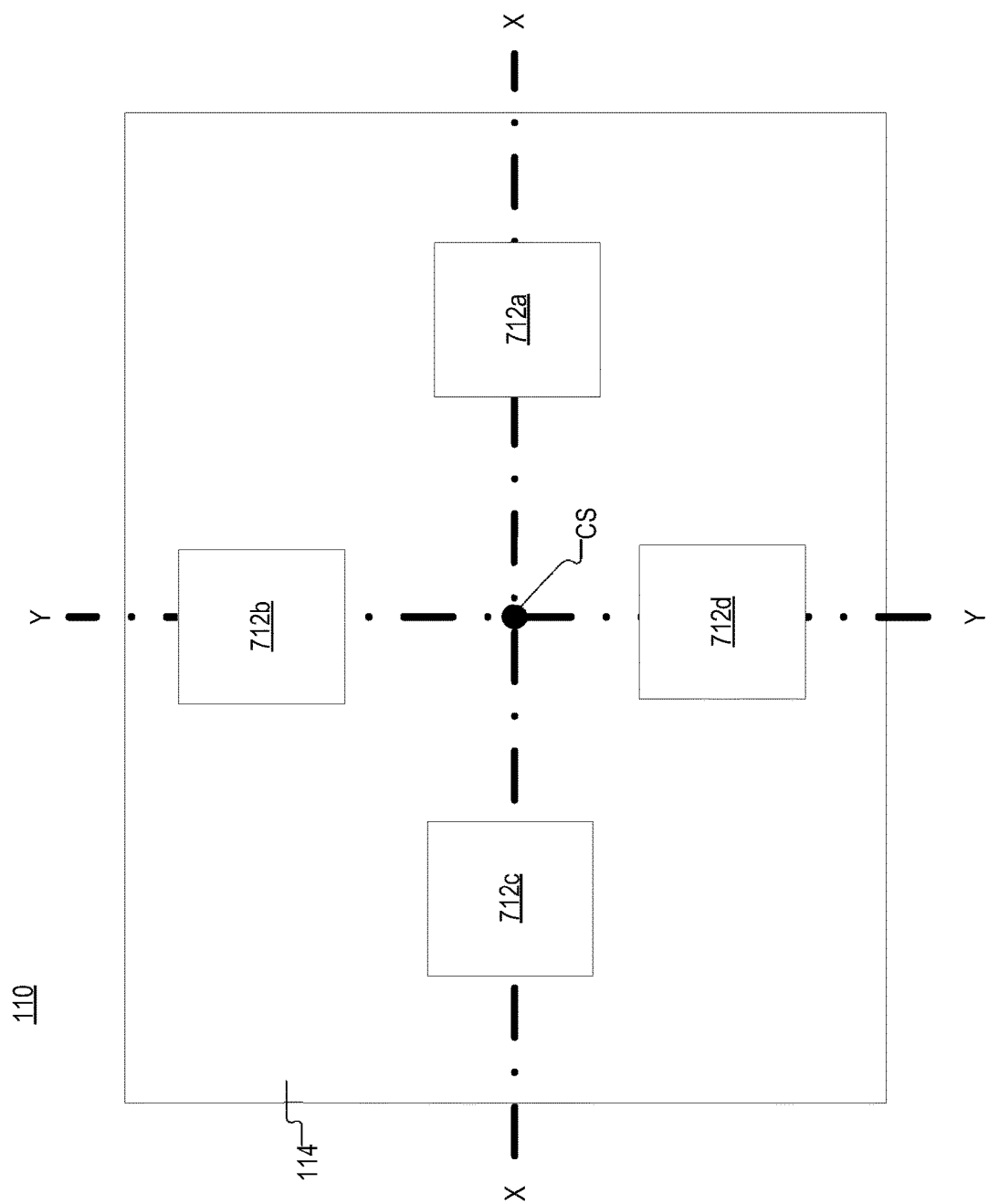
FIG. 7C is cross-sectional side view of the sensor of the system of FIG. 7A, according to aspects of the disclosure.

FIGS. 7A-C show an example of a system 700, according to aspects of the disclosure. As illustrated, the system 700 may include a sensor 710 and a ring magnet 720. The ring magnet 720 may include a top surface 722, a bottom surface 724, and a bore 726 that extends from the top surface 722 to the bottom surface 724. The sensor 710 may be disposed adjacent to the bottom surface 724 of the ring magnet 720 directly above the bore 726 of the ring magnet 120. In other implementations, the sensor 710 may be disposed adjacent to the top surface of the ring magnet 720 directly below the bore 726 of the ring magnet 120. In implementations in which the sensor 710 is off-center from the ring magnet 120, additional circuitry may be used to compensate for harmonic distortion resulting from the off-center positioning of the sensor 710. The sensor 710 may include planar Hall elements 712 that are formed on a substrate 714. The substrate 714 may include an axis X-X and an axis Y-Y. The axes X-X and Y-Y are orthogonal with each other, and they may intersect at the center CS of the substrate 714. The planar Hall elements 712a and 712c may be centered on the axis X-X. And the planar Hall elements 712b and 712d may be centered on the axis Y-Y. It will be appreciated that planar Hall elements have an axis of maximum sensitivity orthogonal to the major, active surface (e.g., top surface 722) of the substrate.

Figure 8:
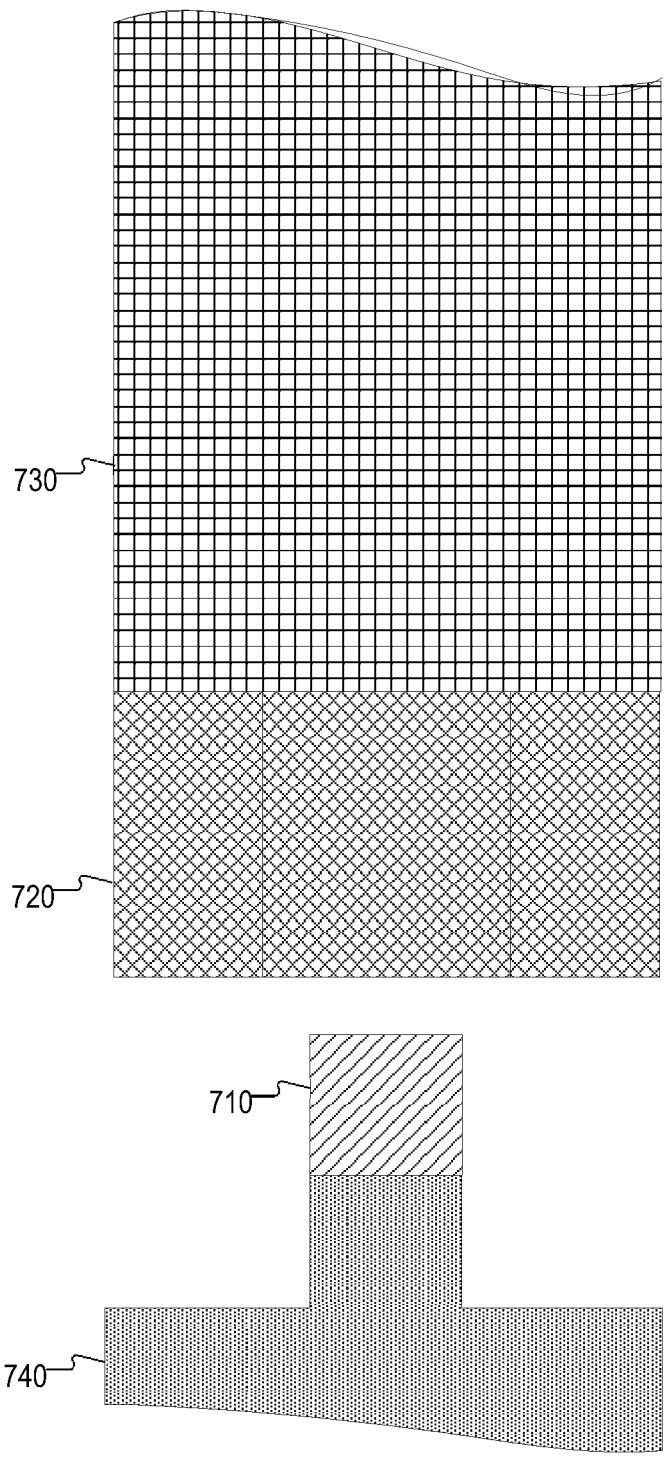
FIG. 8 is schematic diagram illustrating the operation of the system of FIG. 7A, according to aspects of the disclosure.

As illustrated in FIG. 8, the magnet 720 may be coupled to rotating shaft 730 and the sensor 710 may be mounted on a mounting member 740. The ring magnet 720 may turn with the rotating shaft 730, while the sensor 710 may remain fixed in position. As a result of this arrangement, the direction of the magnetic field that is generated by the ring magnet 720 may change, resulting in changes in the signals that are generated by each Hall element group 712. As is discussed further below with respect to FIGS. 9A-10, the signals that are generated by each of the Hall element groups 712 may be used to determine the angular position and/or speed of the rotating shaft 130 (and in some embodiments also the direction of rotation). Although in the example of FIG. 7A-C the sensor 710 is positioned below the ring magnet 120, alternative implementations are possible in which the sensor 710 is positioned above the ring magnet 120. Although in the example of FIGS. 7A-C the magnet 720 is a ring magnet, alternative implementations are possible in which the magnet 720 is a disk, or puck magnet and/or any other suitable type of magnet.

In some respects, arranging the planar Hall elements 712 in this manner is advantageous because it allows the calculation of the angular position (and/or speed) of the ring magnet 720 to be simplified. A simplified approach for calculating the angular position of the ring magnet 720 based on signals generated by the planar Hall elements 712 is discussed further below with respect to FIGS. 9A-B and 11.

Figure 9A:
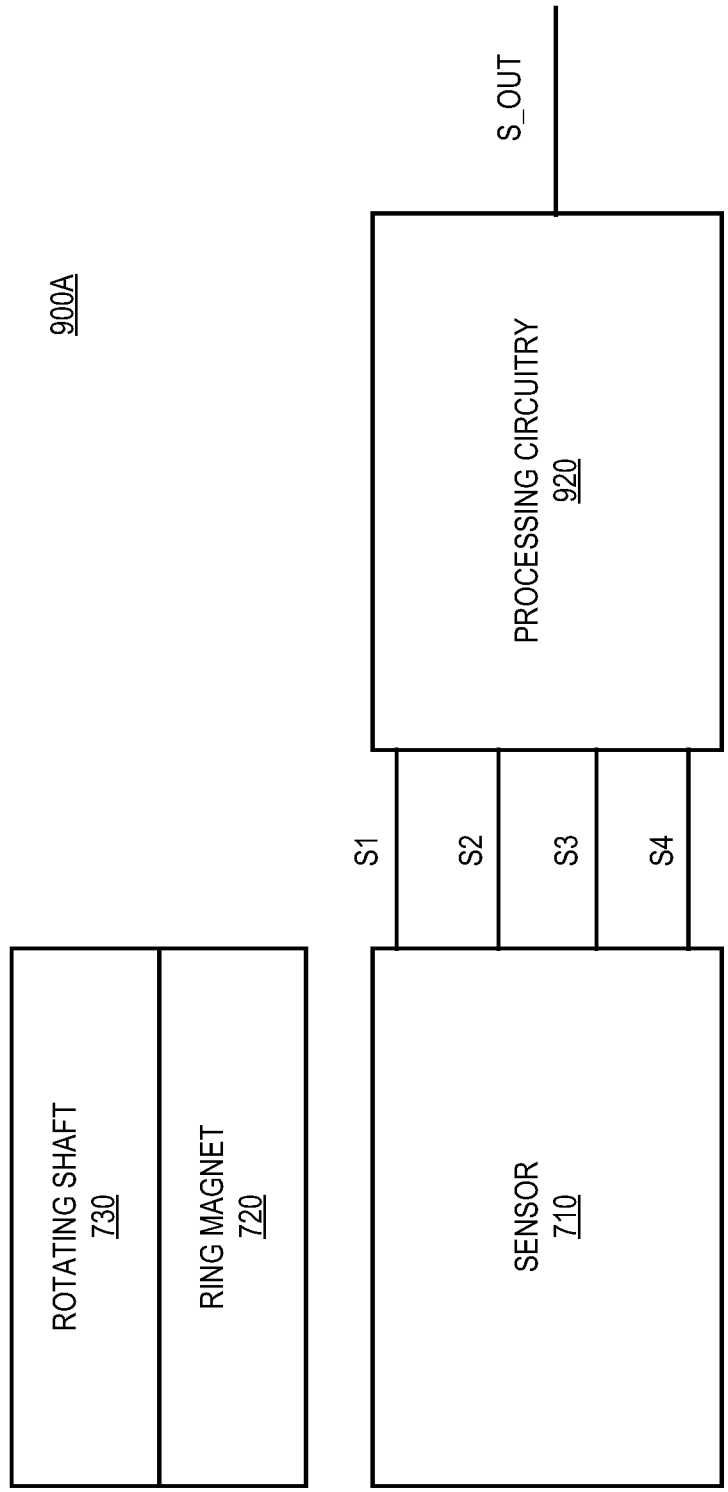
FIG. 9A is a schematic diagram of the system of FIG. 8A, according to aspects of the disclosure.

FIG. 9A shows an example of a system 900A, according to aspects of the disclosure. The system 900A may include the rotating shaft 730, the ring magnet 720, and the sensor 710, and a processing circuitry 920 that is operatively coupled to the sensor 710. The processing circuitry may be configured to receive signal S1, S2, and S3, and S4 and generate a signal S_OUT based on the signals S1, S2, S3, and S4, respectively. The signal S1 may be generated by the planar Hall element 712a; the signal S2 may be generated by the planar Hall element 812b; the signal S3 may be generated by the planar Hall element 712c; and the signal S4 may be generated by the planar Hall element 712d. The signal S_OUT may indicate the position and/or speed of rotation of the ring magnet 720 (and/or rotating shaft 730). The manner in which the signal S_OUT is generated is discussed further below with respect to FIG. 9B.

Figure 9B:
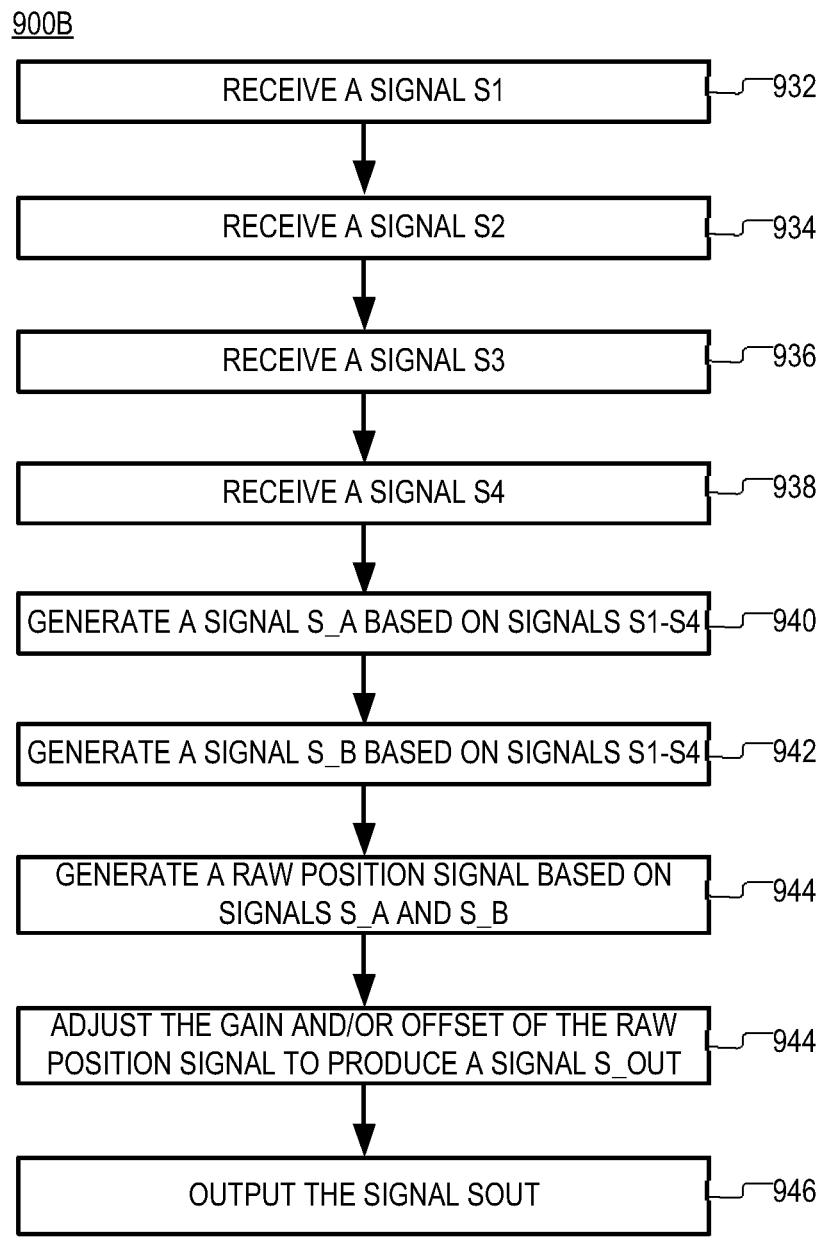
FIG. 9B is a flowchart of an example of a process, according to aspects of the disclosure.

FIG. 9B is a flowchart of an example of a process 900B for generating the signal S_OUT. According to the example of FIG. 9B, the process 900B is performed by the processing circuitry 920. However, alternative implementations are possible in which the process 900B is performed by another device. Stated succinctly, the present disclosure is not limited to any specific implementation of the process 900.

At step 932, the processing circuitry 920 receives the signal S1 from the sensor 710. As noted above, the signal S1 is generated by the planar Hall element 712a.

At step 934, the processing circuitry 920 receives the signal S2 from the sensor 710. As noted above, the signal S2 is generated by the planar Hall element 712b.

At step 936, the processing circuitry 920 receives the signal S3 from the sensor 710. As noted above, the signal S3 is generated by the planar Hall element 712c.

At step 938, the processing circuitry 920 receives the signal S4 from the sensor 710. As noted above, the signal S4 is generated by the planar Hall element 712d.

At step 940, a signal S_A is generated based on signals S1-S4. In some implementations, the signal S_A may be generated in accordance with equation 6 below:

$$S\_A=S1+S2-S3-S4 \quad (Eq.\ 6)$$

At step 940, the processing circuitry 920 generates a signal S_B based on signals S1-S4. In some implementations, the signal S_B may be generated in accordance with equation 7 below:

$$S\_B=S1-S2-S3+S4 \quad (Eq.\ 7)$$

At step 942, the processing circuitry 920 generates a raw position signal based on the signals S_A and S_B. The raw position signal may indicate the angular position and/or speed of rotation of the ring magnet 120 (and/or rotating shaft 730). In some implementations, the raw position signal be generated in accordance with equation 8 below:

$$S_{raw} = \arctan\left(\frac{S\_A}{S\_B}\right) \quad (Eq.\ 8)$$

where $S_{raw}$ is the raw position signal.

At step 944, the processing circuitry 920 generates a signal S_OUT by adjusting the gain and/or offset of the raw position signal. The gain and offset may be adjusted in a well-known fashion based on a signal that is provided by a temperature sensor and/or other data. Although in the example of FIG. 9B gain and offset adjustment is performed on the raw position signal, alternative implementations are possible in which gain and/or offset adjustment is performed on any of the signals S1-S4 instead. In this regard, it will be understood that the present disclosure is not limited to any specific method for performing gain and/or offset adjustment.

At step 946, the processing circuitry 920 outputs the signal S_OUT to another device (not shown) that is operatively coupled to the processing circuitry 920.

Figure 10:
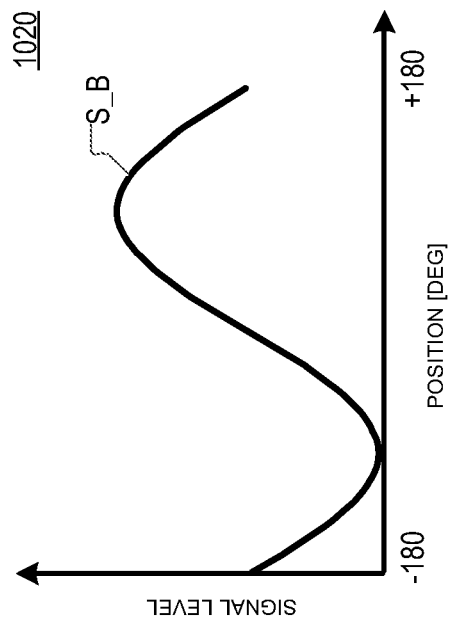
FIG. 10 is a plot of signals that are generated by using the sensor 710, according to aspects of the disclosure.
Figure 10:
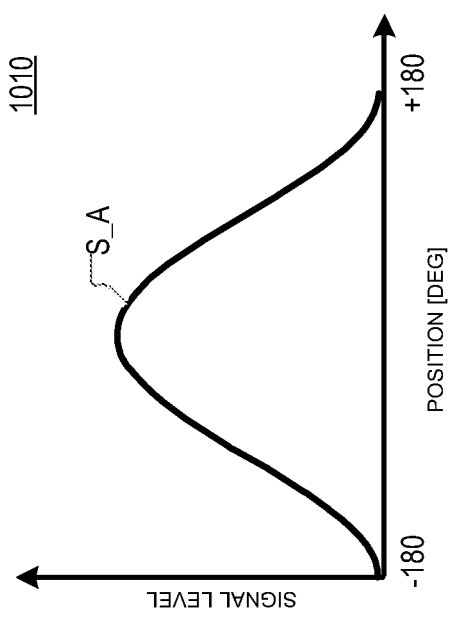

FIG. 10 shows a plot 1010 of the signal S_A and a plot 1020 of the signal S_B. As illustrated, in some implementations, the signal S_A may have a substantially sinusoidal waveform, and the signal S_B may have a substantially cosinusoidal waveform. According to the example of FIGS. 9A-10, the signals S_A and S_B are in quadrature with one another.

Figure 11:
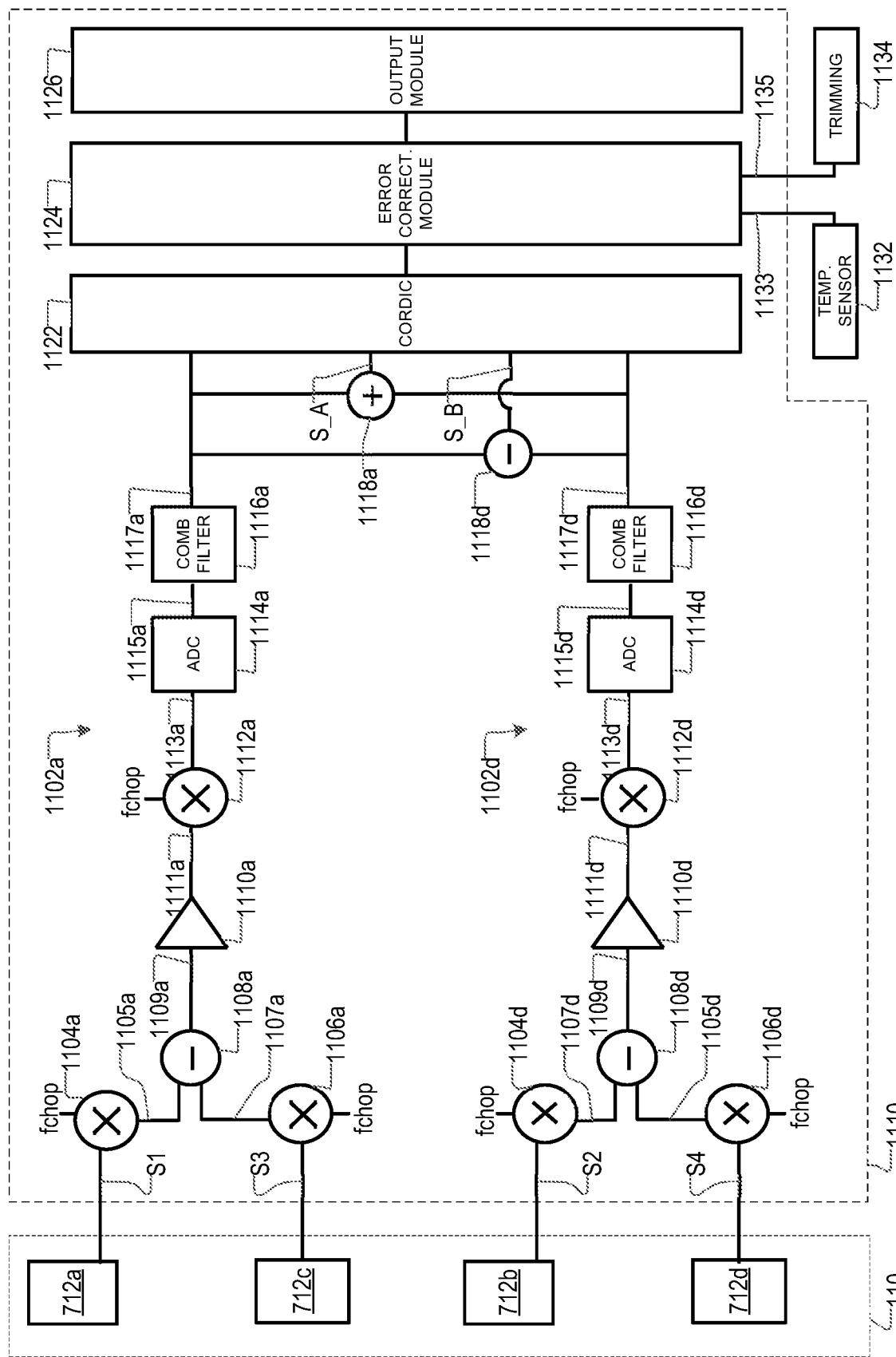
FIG. 11 is a circuit diagram of a system including the sensor of FIG. 7C, according to aspects of the disclosure.

FIG. 11 is a circuit diagram of a processing circuitry 1110 that is used in conjunction with the sensor 110. The processing circuitry 1110 may include a processing path 1102a and a processing path 1102d. The processing path 1102a may be arranged to process signals that are generated by the planar Hall elements 712a and 712c and the processing path 1102d may be arranged to process signals that are generated by the planar Hall elements 712b and 712d.

The planar Hall element 712a may generate a signal S1 that is subsequently provided to a modulator 1104a. The modulator 1104a may modulate the signal S1 based on a frequency fchop to produce a modulated signal 1105a. The planar Hall element 712c may generate a signal S3 that is subsequently provided to a modulator 1106a. The modulator 1106a may modulate the signal S3 based on the frequency fchop to produce modulated signal 1107a. A subtractor 1108a may subtract the modulated signal 1107a from the modulated signal 1107a to produce a signal 1109a, which is subsequently provided to an amplifier 1110a. As can be readily appreciated, subtracting the two signals from one another may cancel out the effects of stray magnetic fields that are incident on the planar Hall elements 712a and 712c, resulting in a signal 1109a that is stray field immune. The amplifier 1110a may amplify the signal 1109a to produce an amplified signal 1111a, which is subsequently provided to a demodulator 1112a. The demodulator 1112a may demodulate the amplified signal 1113a based on the frequency fchop to produce a demodulated signal 1113a, which is subsequently provided to an analog-to-digital converter (ADC) 1114a. The ADC 1114a may digitize the demodulated signal 1113a to produce a digital signal 1115a, which is subsequently provided to a filter 1116a, such as a comb filter. The comb filter 1116a may filter the digital signal 1115a to produce a filtered signal 1117a, which is subsequently provided to a CORDIC module 1122.

The planar Hall element 712b may generate a signal S2 that is subsequently provided to a modulator 1104a. The modulator 1104d may modulate the signal S2 based on a frequency fchop to produce a modulated signal 1105a. The planar Hall element 712d may generate a signal S4 that is subsequently provided to a modulator 1106a. The modulator 1106d may modulate the signal S4 based on the frequency fchop to produce modulated signal 1107d. A subtractor 1108d may subtract the modulated signal 1107d from the modulated signal 1105d to produce a signal 1109d, which is subsequently provided to an amplifier 1110d. As can be readily appreciated, subtracting the two signals from one another may cancel out the effects of stray magnetic fields that are incident on the planar Hall elements 712b and 712d, resulting in a signal 1109d that is immune to stray fields. The amplifier 1110d may amplify the signal 1109d to produce an amplified signal 1111d, which is subsequently provided to a demodulator 1112a. The demodulator 1112d may demodulate the amplified signal 1113d based on the frequency fchop to produce a demodulated signal 1113a, which is subsequently provided to an analog-to-digital converter (ADC) 1114a. The ADC 1114d may digitize the demodulated signal 1113d to produce a digital signal 1115d, which is subsequently provided to a comb filter 1116d. The comb filter 1116d may filter the digital signal 1115d to produce a filtered signal 1117a, which is subsequently provided to a CORDIC module 1122. A summation element 1118a may add the signals 1117a and 1117d to produce a signal S_A, which is subsequently provided to the CORDIC module. A summation element 1118d may add the subtract the signal 1117d from the signal 1117a to produce a signal S_B, which is subsequently provided to the CORDIC module.

The CORDIC module 1122 may include any suitable type of processing circuitry that is configured to execute a Coordinate Rotation Digital Computer (CORDIC) algorithm or otherwise compute an arctangent function (e.g., such as by using a look-up table). According to the example of FIG. 11, the CORDIC module is configured to calculate a raw position signal based on the signals S_A and S_B. The raw position signal may identify the angular position and/or speed of rotation of the ring magnet 720 relative to the sensor 710. In some implementations, the raw position signal may be calculated in accordance with Equation 9 below:

$$S_{raw} = \arctan\left(\frac{S\_A}{S\_B}\right) \quad (Eq.\ 9)$$

where $S_{raw}$ is the raw position signal.

The error correction module 1124 may include any suitable type of processing circuitry for adjusting the gain and/or offset of the raw position signal that is produced by the CORDIC module 1122. In operation, the error correction module 1124 may receive the raw position signal from the CORDIC module 1122 and generate an adjusted signal based on the received raw position signal. The adjusted signal may be generated by adjusting the gain and/or offset of the raw position signal. The gain and/or offset of the raw position signal may be adjusted, in a well-known fashion, based on a signal 1133 that is generated by a temperature sensor 1132. Additionally or alternatively, the gain and/or offset of the raw position signal may be adjusted based on a signal 1135 that is generated by a trim module 1134. The trim module 1134 may be a memory that is arranged to provide (to the error correction module) one or more coefficients for adjusting the gain and/or offset of the raw position signal. However, alternative implementations are possible in which the trim module 1134 includes another type of device (e.g., a humidity sensor, etc.) that is used for correcting the gain and/or offset of the raw position signal. Stated succinctly, the present disclosure is not limited to any specific method for adjusting the gain and/or offset of the raw position signal.

The output module 1126 may include any suitable type of communications interface for outputting the adjusted signal that is produced by the error correction module 1124. The output block may format the adjusted signal into a desired output signal format and provide the formatted signal to another device (e.g., an Engine Control Unit) that is coupled to the output module 1126. The desired format may be PWM format, Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format to name a few non-limiting examples.

Figure 12:
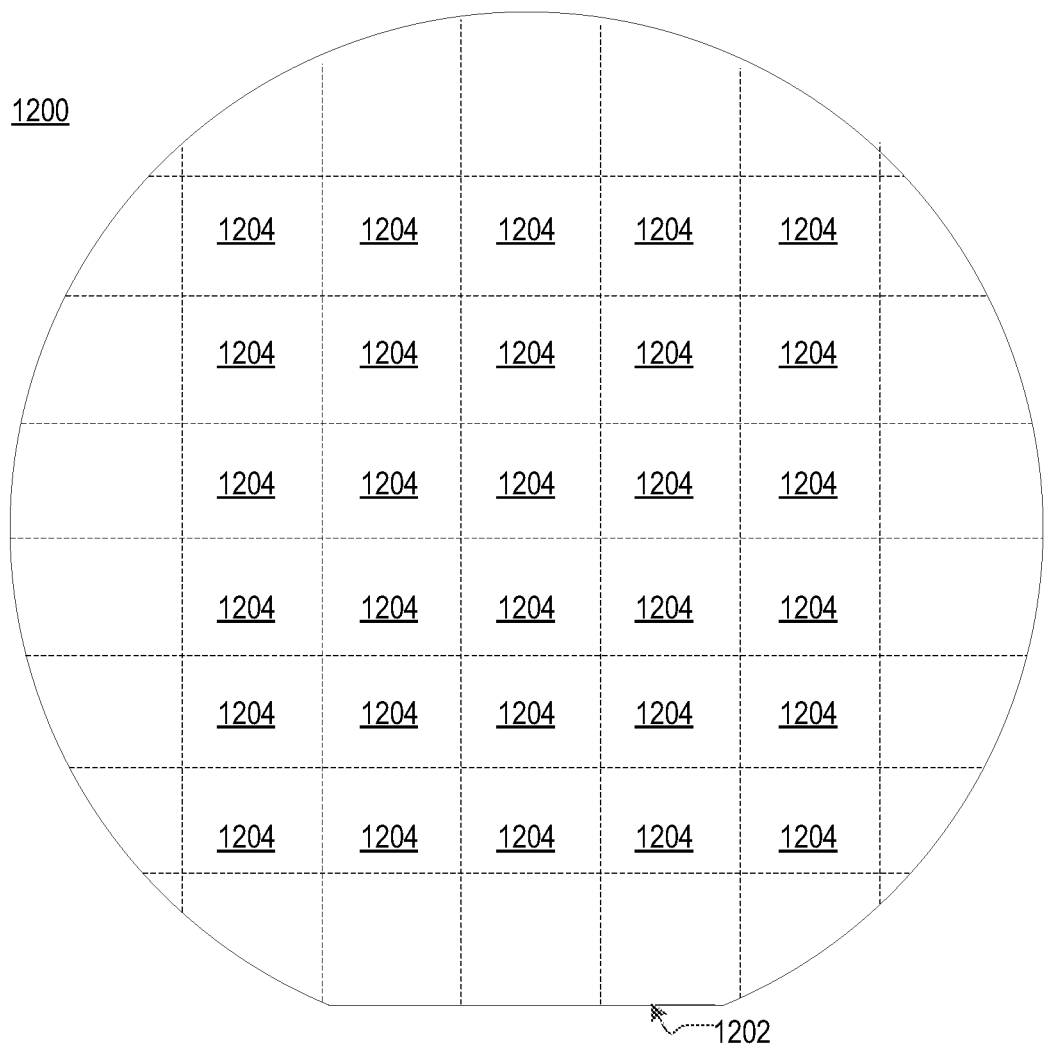
FIG. 12 is a top-down view of an example of a wafer, according to aspects of the disclosure.

FIG. 12 is a diagram of an example of a wafer 1200, according to aspects of the disclosure. In the example of FIG. 12, the wafer 1200 is provided with a flat 1202 denoting the crystal orientation of the wafer 1200. Although in the example of FIG. 12 the wafer 1200 is provided with a flat to denote the crystal orientation of the wafer 1200, alternative implementations are possible in which the wafer 1200 is provided with a notch instead.

In general, when a wafer is cut from a silicon ingot, the surface of the wafer is aligned with one of the several orientations of the crystal lattice of the ingot. This orientation is known as the crystal orientation of the wafer. The crystal orientation of a wafer is usually determined by the manufacturer and marked using a flat, such as the flat 1202, or a notch. The crystal orientation of a wafer may be defined by the Miller index, with (100) or (110) faces being the most common for silicon. The crystal orientation of a wafer is important since many of a single crystal's structural properties are highly anisotropic, which in turn causes mechanical stresses to propagate differently across the wafer in different directions.

According to the example of FIG. 12, the wafer 1200 is used to manufacture magnetic field sensors that use vertical Hall elements to detect a magnetic field. Specifically, the wafer 1200 may be divided into a plurality of sensor dies 1204, and each of the sensor dies 1204 may have one or more vertical Hall elements that are formed thereon. The configuration of any of the sensor dies 1204 is discussed further below with respect to FIGS. 13A-D.

The sensor dies 1204 may be aligned with the crystal orientation of the wafer 1200. Each of the sensor dies 1204 may have a rectangular shape. Each of the sensor dies 1204 may have two edges that are perpendicular to the crystal orientation of the wafer 1200 and two edges that are parallel to the crystal orientation of the wafer. This is consistent with the standard practice in the industry, which involves cutting (or scoring and breaking) silicon dies along and perpendicular to the crystal orientation of the wafer of which they are formed.

The sensitivity of a sensor containing vertical Hall elements may be compromised by mechanical stress that is incident on the sensor. Such mechanical stress may include stress resulting from thermal expansion, stress that is imparted on the sensor die when the die is packaged, or stress that is imparted on the sensor die when a semiconductor package containing the die is soldered onto a circuit board.

In one aspect, according to the present disclosure, it has been determined that the sensitivity of vertical Hall elements would change less in response to mechanical stress when the vertical Hall elements are oriented at +/−45 degrees relative to the crystal orientation of the die on which they are formed, when the crystal orientation of the die is (110), which is the most common in the industry. Specifically, according to the present disclosure, it has been determined that magnetic field sensor configurations in which vertical Hall elements are oriented at +/−45° angle relative to the crystal orientation (110) of the sensor die, on which they are formed, are less susceptible to the effects of mechanical stress (on the sensitivity of the vertical Hall elements or the sensor) than sensor configurations in which the vertical Hall elements are either parallel or perpendicular to the edges of the sensor die (in embodiments in which some of the edges of the sensor die are parallel to the crystal orientation). In other words, according to the present disclosure, it has been determined that a magnetic field sensor that contains vertical Hall elements can be made more accurate by orienting the vertical Hall elements at an angle of +/−45° relative to the crystal orientation of the die of the sensor.

In another aspect, according to the present disclosure, it has been determined that placing different pairs of vertical Hall elements in respective corners of a substrate, and arranging one of the elements in each pair to face the pair's respective corner while arranging the other one of the elements in the pair to face away from the respective corner is also advantageous because it may result in a higher amount of magnetic flux being incident on each pair than if the vertical Hall element pairs were not disposed at the corners of the substrate, but were closer to the center of the substrate. In other words, positioning the vertical Hall elements in the corner of the substrate, and orienting them as described, could increase the sensitivity of a magnetic field sensor with respect to the position of a ring magnet, such as the ring magnet 1420 (shown in FIG. 14A). An example implementation of a sensor in which the vertical Hall elements are arranged in pairs and oriented as described is shown in FIG. 14B.

An example of a sensor configuration in which the vertical Hall elements are oriented at an angle relative to the crystal orientation of the sensor die is discussed further below with respect to FIGS. 13A-D. Examples of sensor configurations in which the vertical Hall elements are either parallel or perpendicular to the edges of the sensor die are provided above with respect to FIGS. 3A-4B. According to the present disclosure, it has been determined that the configuration discussed further below 13A-D can have improved resistance to stress than the configurations discussed with respect to FIGS. 3A-4B when the vertical Hall elements are oriented at an angle of +/−45° relative to the crystal orientation of the die of the sensor die.

Although in the example of FIG. 12, the wafer 1200 is a silicon wafer, alternative implementations are possible in which the wafer 1200 is formed of another material, such as sapphire for example. Stated succinctly, the present disclosure is not limited to any specific implementation of the wafer 1200.

Figure 13A:
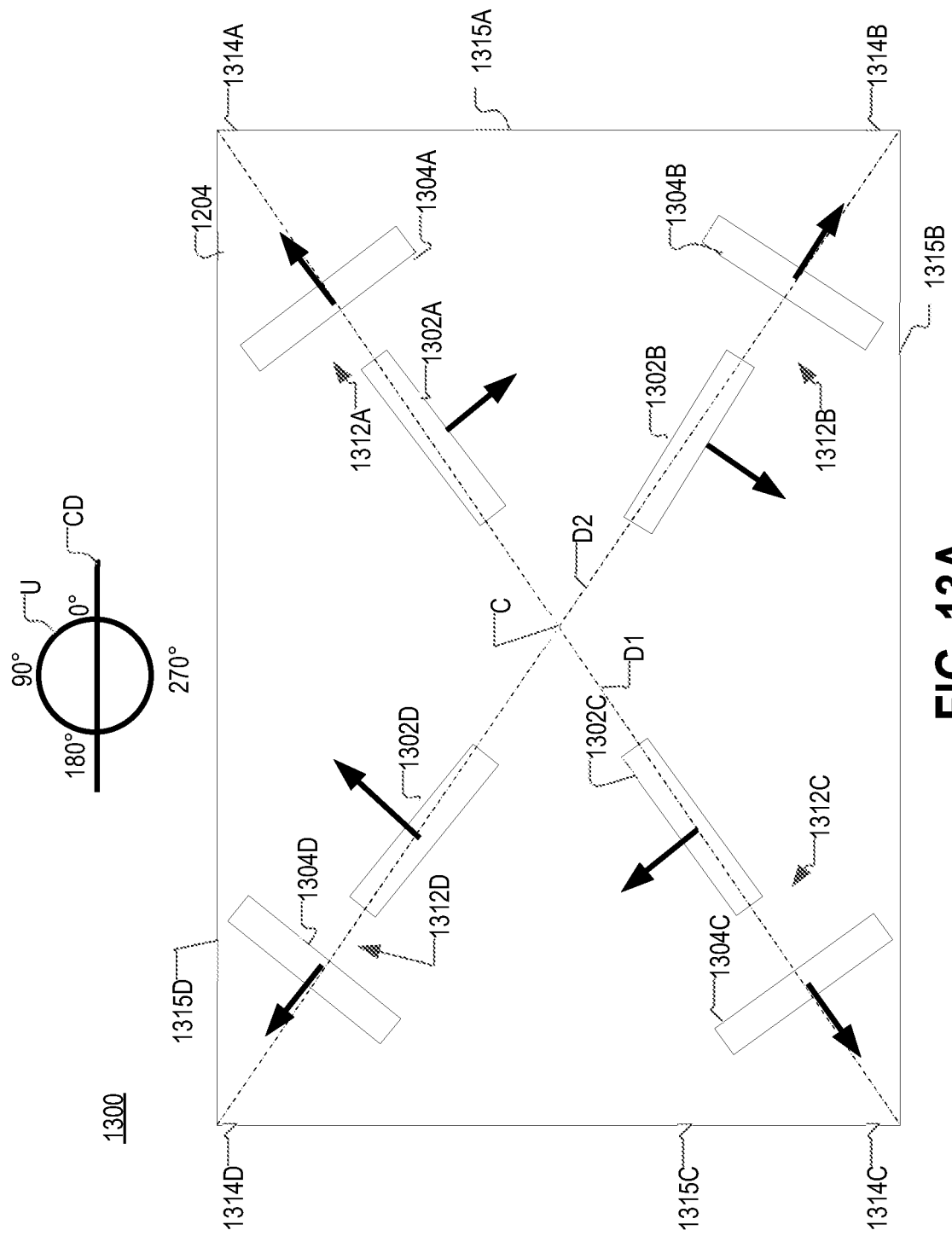
FIG. 13A is a top-down view of an example of a sensor, according to aspects of the disclosure.

FIG. 13A shows an example of a sensor 1300, according to aspects of the disclosure. As illustrated, the sensor 1300 may include pairs 1312A-D of vertical Hall elements. Pair 1312A may include vertical Hall elements 1302A and 1304A; pair 1312B may include vertical Hall elements 1302B and 1304B; pair 1312C may include vertical Hall elements 1302C and 1304C; and pair 1312D may include vertical Hall elements 1302D and 1304D. The vertical Hall elements in each of the pairs 1312A-D may be formed on a sensor die 1204. Although not shown, also formed on the sensor die 1204 may be signal processing circuitry, such as the processing circuitry 1510, which is discussed further below with respect to FIG. 15.

In some implementations, each of the vertical Hall elements in each (or at least one) of the pairs 1312A-D may be arranged at an angle relative to the crystal orientation of the sensor die 1204. Examples of different ways to arrange a vertical Hall element at an angle relative to the crystal orientation of a sensor die are provided further below with respect to FIG. 13B.

Additionally or alternatively, in some implementations, the vertical Hall element 1304 in each of the pairs 1312A-D may be arranged to face a respective corner of the sensor die 1204, while the vertical Hall element 1302 in the same pair is arranged to face away from the same corner. Examples of different ways to arrange a vertical Hall element to face a corner of a sensor die are discussed further below with respect to FIG. 13C. Examples of different ways to arrange a vertical Hall element to face away from a corner of a sensor die are discussed further below with respect to FIG. 13D.

In the example of FIG. 13A, the vertical Hall element 1304A is arranged to face corner 1314A of the sensor die 1204 and the vertical Hall element 1302A is arranged to face away from the corner 1314A of the sensor die 1204. The vertical Hall element 1304B is arranged to face corner 1314B of the sensor die 1204 and the vertical Hall element 1302B is arranged to face away from the corner 1314B of the sensor die 1204. The vertical Hall element 1304C is arranged to face corner 1314C of the sensor die 1204 and the vertical Hall element 1302C is arranged to face away from the corner 1314C of the sensor die 1204. The vertical Hall element 1304D is arranged to face corner 1314D of the sensor die 1204 and the vertical Hall element 1302D is arranged to face away from the corner 1314D of the sensor die 1204.

Each of the vertical Hall elements 1302A-D and 1304A-D may have a respective axis of maximum sensitivity. The axis of maximum sensitivity of each of the vertical Hall elements 1302A-D and 1304A-D is denoted in FIG. 13A as a solid black arrow that is superimposed over the vertical Hall element.

In some implementations, the axes of maximum sensitivity of the vertical Hall elements 1302A-D and 1304A-D may be aligned with the diagonals D1 and D2 of the sensor die 1204. Specifically, the axis of maximum sensitivity of vertical Hall element 1302A may be substantially perpendicular to diagonal D1 of the sensor die 1204. The axis of maximum sensitivity of vertical Hall element 1304A may be substantially parallel to diagonal D1 of the sensor die 1204. The axis of maximum sensitivity of vertical Hall element 1302B may be substantially perpendicular to diagonal D2 of the sensor die 1204. The axis of maximum sensitivity of vertical Hall element 1304B may be substantially parallel to diagonal D2 of the sensor die 1204. The axis of maximum sensitivity of vertical Hall element 1302C may be substantially perpendicular to diagonal D1 of the sensor die 1204. The axis of maximum sensitivity of vertical Hall element 1304C may be substantially parallel to diagonal D1 of the sensor die 1204. The axis of maximum sensitivity of vertical Hall element 1302D may be substantially perpendicular to diagonal D2 of the sensor die 1204. The axis of maximum sensitivity of vertical Hall element 1304D may be substantially parallel to diagonal D2 of the sensor die 1204. As illustrated, in some implementations, pairs 1312A-D may be symmetrical with respect to the center C of the sensor die 1204. As used throughout the disclosure, the term "substantially" as used in the phrase "substantially perpendicular" shall mean within "10 degrees of a right angle".

Additionally or alternatively, in some implementations, one of the vertical Hall elements in each of the pairs 1312A-D may be offset by +X° from the crystal orientation of the sensor die 1204, and the other one of the vertical Hall elements in each of the pairs 1312A-D may be offset by −(90-X)°, where X is a positive integer, and X<90. In some implementations, the value of X may be 45° for pairs 1312A and 1312C, and 135° for pairs 1312B and 1312D.

More precisely, the angle between the axis of maximum sensitivity of each of the vertical Hall elements 1302A-D and 1304A-D may be expressed within the framework of a unit circle U, which is also shown in FIG. 13A. In that framework, line CD extends between 0° and 180° and denotes the crystal orientation of the sensor die 1204. The axes of maximum sensitivity of vertical Hall elements 1302A-D and 1304A-D may be oriented as follows: the axis of maximum sensitivity of vertical Hall element 1304A may be oriented at 45°, the axis of maximum sensitivity of vertical Hall element 1304B may be oriented at 315°, the axis of maximum sensitivity of vertical Hall element may be oriented at 225°, the axis of maximum sensitivity of vertical Hall element 130D may be oriented at 135°, the axis of maximum sensitivity of vertical Hall element 1312A may be oriented at 315°, the axis of maximum sensitivity of vertical Hall element 1302B may be oriented at 225°, the axis of maximum sensitivity of vertical Hall element 1302C may be oriented at 135°, and the axis of maximum sensitivity of vertical Hall element 1302D may be oriented at 45°. Depending on how one chooses to describe the angles, it can be readily appreciated that under the latter arrangement, the smallest angle between line CD and the axis of maximum sensitivity of each of the vertical Hall elements 1302A-D and 1304A-D is either +45° or −45°. Although in the example of FIG. 13A the sensor die 1204 has a rectangular shape, alternative implementations are possible in which the sensor die 1204 has a square shape. As discussed above, arranging the vertical Hall elements at +/−45° relative to the crystal orientation of the sensor die 1204 is advantageous because it could enhance the sensor's resilience to mechanical stress and make the sensor more accurate. In some implementations, when the sensor die 1204 has a square shape, the axes of maximum sensitivity of the Hall elements 1302A-D and 1304A-D may be either substantially perpendicular or substantially parallel to the diagonals of the die.

Although, in the example of FIG. 13A, the vertical Hall elements in each of the pairs 1312A-D are rotated (in opposite directions) by the same amount relative to the crystal orientation of the sensor die 1204, alternative implementations are possible in which any two vertical Hall elements that are part of the same pair 1312 are rotated in opposite directions and by different amounts from the crystal orientation of the sensor die 1204.

The vertical Hall elements 1302A-D and 1304A-D may be disposed in the periphery of the sensor die 1204. In some implementations, the distance between each (or at least one) of the vertical Hall elements 1302A-D and 1304A-D and the nearest edge of the sensor die 1204 may be at least 90% smaller than the distance between that vertical Hall element and the center C of the sensor die 1204. In some implementations, the distance between each (or at least one) of the vertical Hall elements 1302A-D and 1304A-D and the nearest edge of the sensor die 1204 may be many times smaller (e.g., 5 times, 10 times, 20 times, etc.) than the distance between that vertical Hall element and the center C of the sensor die 1204.

Additionally or alternatively, in some implementations, the vertical Hall elements 1302A-D and 1304A-D may be formed as close to the edges 1315A-D of the sensor die as permitted by manufacturing tolerances. Additionally or alternatively, in some implementations, each of the vertical Hall elements 1304A-D may be formed as close as possible to one of the corners 1314A-D as permitted by the manufacturing tolerances. Additionally or alternatively, in some implementations, each of the vertical Hall elements 1302A-D may be formed as close as possible to one of the corners 1314A-D as permitted by the manufacturing tolerances. Additionally or alternatively, in some implementations, each of the pairs 1312A-D may be formed as close as possible to a different one of the corners 1314A-D as permitted by the manufacturing tolerances.

Although, in the example of FIG. 13A, the vertical Hall element 1302 in each of the pairs 1312A-D is situated between the vertical Hall element 1304 which is part of the same pair and the center C of the sensor die 1204, alternative implementations are possible in which the positions of the vertical Hall elements in the pair are switched (while their orientations remain the same). In the latter case, the vertical Hall element 1304 in each of the pairs 1312A-D may be positioned between the vertical Hall element 1302 in that pair and the center C of the sensor die 1204.

Figure 13B:
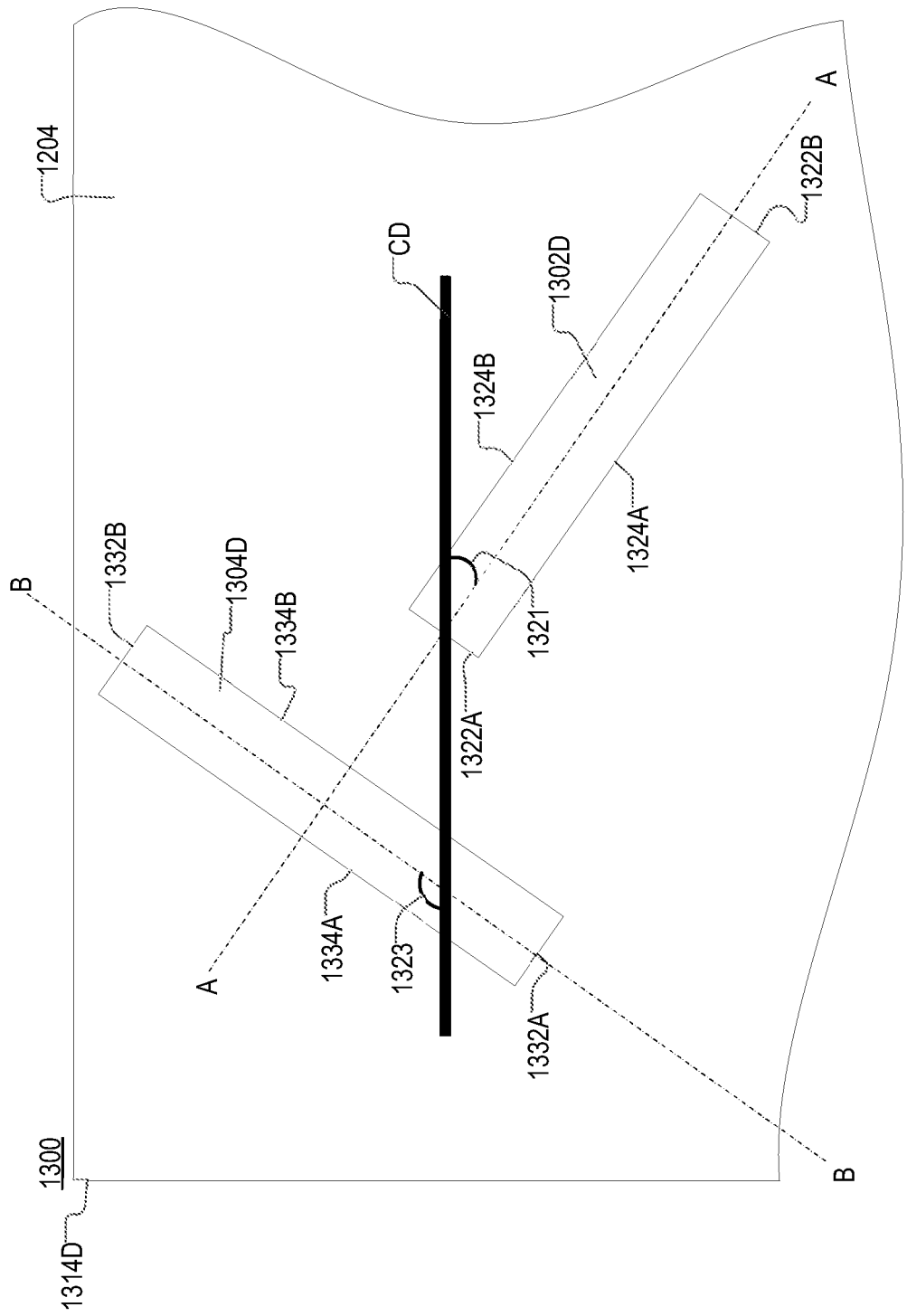
FIG. 13B is a top-down view of a portion of the sensor of FIG. 13A, according to aspects of the disclosure.

FIG. 13B is a partial view of the sensor 1300, which shows the vertical Hall elements 1302D and 1304D in further detail. As illustrated, vertical Hall element 1302D may have short sidewalls 1322A and 1322B and long sidewalls 1324A and 1324B. Sidewalls 1322A and 1322B may be substantially parallel to each other and have the same length. Sidewalls 1324A and 1324B may be substantially parallel to each other and have a greater length than the sidewalls 1322A-B. The vertical Hall element 1302D may have a longitudinal axis A-A that is substantially parallel to the sidewalls 1324A-B. Vertical Hall element 1304D may have long sidewalls 1334A and 1334B, and short sidewalls 1332A and 1332B. Sidewalls 1332A-B may be substantially parallel to each other and have the same length. Sidewalls 1334A-B may also be substantially parallel to each other and have a greater length than the sidewalls 1332A-B. The vertical Hall element 1304D may have a longitudinal axis B-B that is substantially parallel to sidewalls 1324A and 1324B. As used throughout the present disclosure, the phrase "substantially parallel" shall mean "within 10 degrees of being exactly parallel".

Further shown in FIG. 13B is a line CD that has the same direction as the crystal orientation of the sensor die 1204. The longitudinal axis A-A of the vertical Hall element 1302D forms an angle 1321 with line CD (or with the crystal orientation of the sensor die 1204). The longitudinal axis B-B of the vertical Hall element 1304D forms an angle 1323 with line CD (or with the crystal orientation of the sensor die 1204). As discussed above, angles 1321 and 1323 may each be equal to 45°—in other words, in the example of FIG. 13B, the vertical Hall elements 1302D and 1304D are rotated by the same amount and in opposite directions from the line CD. However, it will be understood that alternative implementations are possible in which the vertical Hall elements 1302D and 1304D are rotated by different amounts (and in opposite directions) relative to the crystal orientation of the sensor die 1204, in which case the values of angles 1321 and 1323 would differ. Stated succinctly, the present disclosure is not limited to any specific values for angles 1321 and 1323.

In the example of FIG. 13B, the vertical Hall element 1302D is orientated at an angle relative to the crystal orientation of the sensor die 1204. In one implementation, the vertical Hall element 1302D may be considered to be oriented at an angle relative to the crystal orientation of the sensor die 1204 when the angle 1321 exceeds a predetermined threshold T1 while remaining below a threshold T2 (and/or when the angle between one of the sidewalls 1324A and 1324B is between thresholds T1 and T2). By way of example, the threshold T1 may be equal to one of 5°, 15°, 25°, 35°, 45°, 55°, 65°, 75°, or 85°, and the threshold T2 may be equal to 5°. In other words, the vertical Hall element 1302D may be orientated at an angle relative to the crystal orientation of the sensor die 1204 when the longitudinal axis A-A (and/or at least one of the sidewalls 1324A-B) is neither parallel (e.g., substantially parallel) nor perpendicular (e.g., substantially perpendicular) to the crystal orientation of the sensor die 1204.

In the example of FIG. 13B, the vertical Hall element 1304D is orientated at an angle relative to the crystal orientation of the sensor die 1204. In one implementation, the vertical Hall element 1304D may be considered to be oriented at an angle relative to the crystal orientation of the sensor die 1204 when the angle 1323 exceeds a predetermined threshold T3 while remaining below a threshold T4 (and/or when the angle between one of the sidewalls 1324A and 1324B is between thresholds T1 and T2). By way of example, the threshold T3 may be equal to one of 35°, 45°, 55°, 65°, 75°, 85°, and the threshold T4 may be equal to 35°. In other words, the vertical Hall element 1304D may be orientated at an angle relative to the crystal orientation of the sensor die 1204 when the longitudinal axis B-B (and/or at least one of the sidewalls 1334A-B) is neither parallel (e.g., substantially parallel) nor perpendicular (e.g., substantially perpendicular) to the crystal orientation of the sensor die 1204.

In some implementations, each of the vertical Hall elements 1302A-C may have the same or similar configuration as vertical Hall element 1302D. Additionally or alternatively, in some implementations, each of the vertical Hall elements 1304A-C may have the same or similar configuration as the vertical Hall element 1304D. Under ideal circumstances, the axes of maximum sensitivity of each of the vertical Hall elements 1302A-D and 1304A-D are perpendicular to the longitudinal axis and/or at least one of the "long" sides of the vertical Hall element. In this regard, any description of the orientation of the axis of maximum sensitivity of a vertical Hall element is also intended (in the alternative) to describe the position in space of the physical dimensions of the vertical Hall element, irrespective of whether the axis of maximum sensitivity ends up in practice being perpendicular to the long walls or longitudinal axis of the vertical Hall element. The examples provided with respect to FIGS. 12-17 assume that the two of the edges of each sensor die 1204 are parallel to the crystal orientation of the sensor die, and the other two are perpendicular. However, it will be understood that the present disclosure is not limited thereto.

FIG. 13C is a partial view of the sensor 1300, which shows the vertical Hall element 1304D in further detail. As illustrated, the vertical Hall element 1304D may be positioned on the sensor die 1204 in such a way that the diagonal D2 of the sensor die 1204 runs through the middle M1 of the sidewall 1334A and through the middle M2 of the sidewall 1334B. The diagonal D2 may form an angle 1325 with the longitudinal axis B-B of the vertical Hall element 1304D. In the example of FIG. 13C the vertical Hall element 1304D is arranged to face the corner 1314D of the sensor die 1204. In some implementations, the vertical Hall element 1304D may be considered to be facing the corner 1314D if the angle 1325 is greater than 15° (or another threshold value such as 25° or 35°). Additionally or alternatively, in some implementations, the vertical Hall element 1304D may be considered to be facing the corner 1314D if the diagonal D2 runs through the middle of both (or at least one) of sidewalls 1334A-B. Additionally or alternatively, in some implementations, the vertical Hall element 1304D may be considered to be facing the corner 1314D if the sidewalls 1332A and 1332B are disposed on opposite sides of the diagonal D2.

Figure 13D:
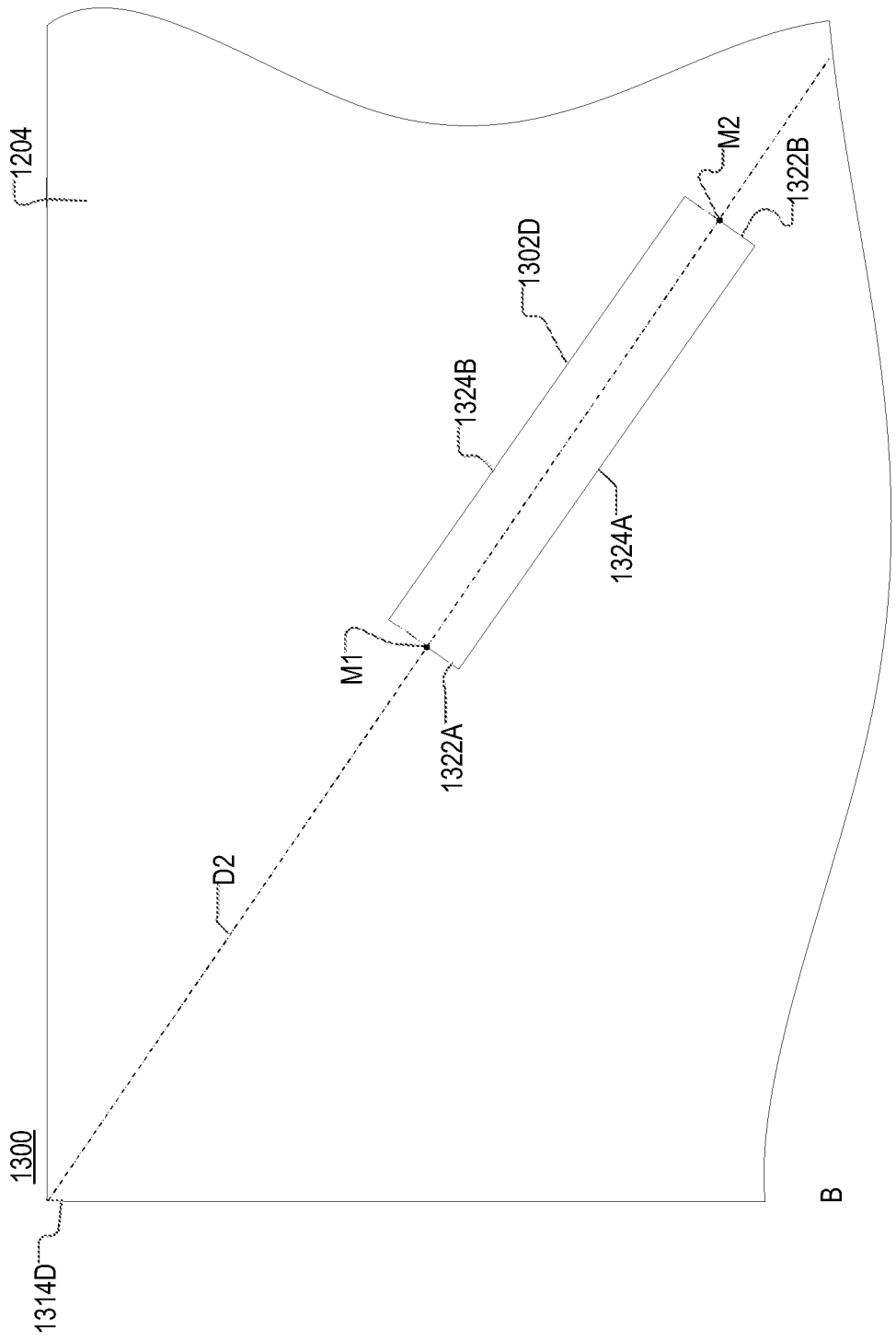
FIG. 13D is a top-down view of a portion of the sensor of FIG. 13A, according to aspects of the disclosure.

FIG. 13D is a partial view of the sensor 1300, which shows the vertical Hall element 1302D in further detail. As illustrated, the vertical Hall element 1302D may be positioned on the sensor die 1204 in such a way that the diagonal D2 of the sensor die 1204 runs through the middle M1 of the sidewall 1322A and through the middle M2 of the sidewall 1322B. In the example of FIG. 13D, the vertical Hall element 1302D is arranged to face away from the corner 1314D of the sensor die 1204. In some implementations, the vertical Hall element 1302D may be considered to be facing away from the corner 1314D if the diagonal D2 runs through the middle of both (or at least one) of sidewalls 1322A-B. Additionally or alternatively, in some implementations, the vertical Hall element 1302D may be considered to be facing away from the corner 1314D if the sidewalls 1324A and 1324B are disposed on opposite sides of the diagonal D2. Additionally or alternatively, in some implementations, the vertical Hall element 1302D may be considered to be facing away from the corner 1314D if the angle between the diagonal D2 and at least one of the sidewalls 1324A-B is less than a threshold. The threshold may be equal to 35°, 45°, etc. Additionally or alternatively, in some implementations, the vertical Hall element 1302D may be considered to be facing away from the corner 1314D if the angle between the diagonal D2 and the longitudinal axis A-A (shown in FIG. 13A) is less than a threshold. The threshold may be equal to 5°, 15°, etc.

FIGS. 14A-B are diagrams of an example of a system 1400, according to aspects of the disclosure. Specifically, FIG. 14A shows a cross-sectional side view of the system 1400 taken along an axis C2-C2 and FIG. 14B shows a cross-sectional top-down view of the system 1400 taken along an axis C1-C1. As illustrated, the system 1400 may include a ring magnet 1420 that is coupled to a rotating shaft 1430. The ring magnet 1420 may be configured to rotate with the rotating shaft 1430. The sensor 1300 may be disposed on a mounting member 1440. The sensor 1300 may be inserted in a bore 1426 of the ring magnet 1420. As illustrated, the bore 1426 may extend between a top surface 1427 and a bottom surface 1429 of the ring magnet 1420. In operation, the rotating shaft 1430 may rotate, and the ring magnet 1420 may rotate together with the rotating shaft 1430. As the ring magnet 1420 rotates, the magnetic field that is produced by the ring magnet 1420 would also rotate, causing the magnetic flux incident on each of the vertical Hall elements in the sensor 1300 to oscillate. At any given point in time, each of the vertical Hall elements in the sensor 1300 may output a signal that is indicative of the magnitude of the magnetic flux incident on that vertical Hall element. As is discussed further below with respect to FIG. 15, the signals generated by the vertical Hall elements in the sensor 1300 may be used to determine the angular position of the ring magnet. Although in the example of FIGS. 14A-B the sensor 1300 is inserted in the bore 1426 of the ring magnet 1420, alternative implementations are possible in which the sensor 1300 is situated above or below the magnet 1420.

Figure 15:
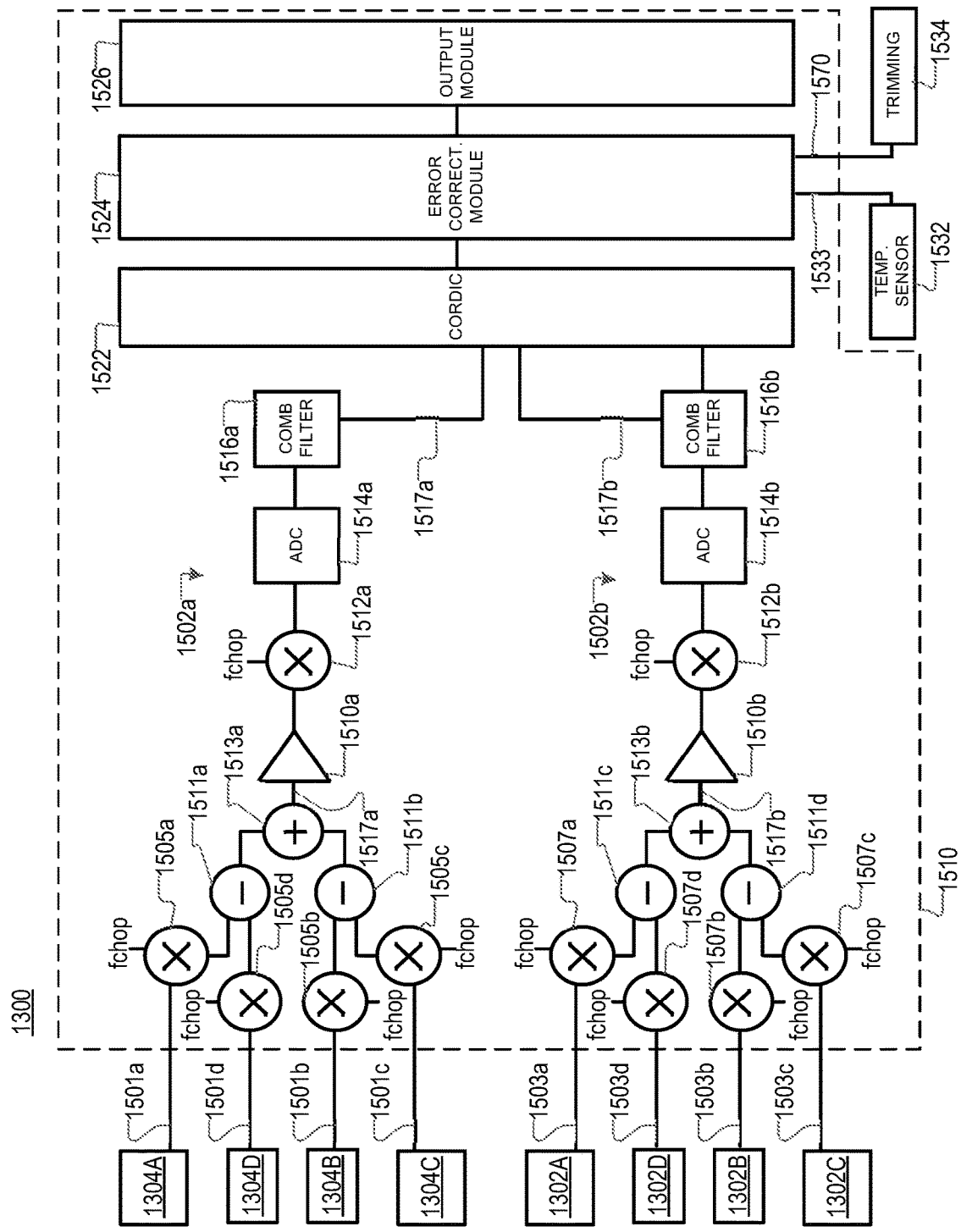
FIG. 15 is a circuit diagram of the sensor of FIG. 13A, according to aspects of the disclosure.

FIG. 15 is a diagram of a processing circuitry 1510 that can be included in the sensor 1300 (shown in FIG. 13). The processing circuitry 1510 may include a processing path 1502b and a processing path 1502b. The processing path 1502a may be arranged to process signals that are generated by the vertical Hall elements 1304A-D and the processing path 1502b may be arranged to process signals that are generated by the vertical Hall elements 1302A-D.

Processing path 1502a may include vertical Hall elements 1304A-D, modulators 1505a-d, subtraction elements 1511a-b, a summation element 1513a, an amplifier 1510a, a demodulator 1512a, an analog-to-digital converter (ADC) 1514a, and a comb filter 1516a. Vertical Hall element 1304A may generate a signal 1501a, which is subsequently modulated by the modulator 1505a. Vertical Hall element 1304D may generate a signal 1501d, which is subsequently modulated by the modulator 1505d. Vertical Hall element 1304B may generate a signal 1501b, which is subsequently modulated by the modulator 1505b. Vertical Hall element 1304C may generate a signal 1501c, which is subsequently modulated with the modulator 1505c. The demodulation of each of the signals 1501a-d may be performed based on a chopping frequency fchop. After the signals 1501a-d are demodulated, modulated signal 1501d may be subtracted from modulated signal 1501a by using the subtraction element 1511a. modulated signal 1501c may be subtracted from modulated signal 1501b by using the subtraction element 1511b. The summation element 1513a may then add the difference of signals 1501d and 1501a with the difference of signals 1501c and 1501b to produce a signal 1517a. The amplifier 1510a may amplify the signal 1517a. The modulator 1512a may modulate the amplified signal 1517a based on the chopping frequency fchop. The ADC 1514a may digitize the modulated signal 1517a. And the comb filter 1516a may filter the digitized signal 1517a.

Processing path 1502b may include vertical Hall elements 1302A-D, demodulators 1507a-d, subtraction elements 1511c-d, a summation element 1513b, an amplifier 1510b, a modulator 1512b, an analog-to-digital converter (ADC) 1514b, and a comb filter 1516b. Vertical Hall element 1302A may generate a signal 1503a, which is subsequently modulated by the modulator 1507a. Vertical Hall element 1302D may generate a signal 1503d, which is subsequently modulated by the modulator 1507d. Vertical Hall element 1302B may generate a signal 1503b, which is subsequently modulated by the modulator 1507b. Vertical Hall element 1302C may generate a signal 1503c, which is subsequently modulated by the modulator 1507*c*. The demodulation of each of the signals 1503*a-d* may be performed based on a chopping frequency fchop. After the signals 1501*a-d* are demodulated, modulated signal 1503*d* may be subtracted from modulated signal 1503*a* by using the subtraction element 1511*c*. modulated signal 1501*c* may be subtracted from modulated signal 1501*b* by using the subtraction element 1511*d*. The summation unit 1513*b* may then add the difference of signals 1503*d* and 1503*a* with the difference of signals 1503*c* and 1503*b* to produce a signal 1517*b*. The amplifier 1510*b* may amplify the signal 1517*b*. The modulator 1512*b* may modulate the amplified signal 1517*b* based on the chopping frequency fchop. The ADC 1514*b* may digitize the modulated signal 1517*b*. The comb filter 1516*b* may filter the digitized signal 1517*b*.

The CORDIC module 1522 may include any suitable type of processing circuitry that is configured to execute a Coordinate Rotation Digital Computer (CORDIC) algorithm or otherwise compute an arctangent function (e.g., such as by using a look-up table). According to the example of FIG. 15, the CORDIC module is configured to calculate a raw position signal based on the filtered signal 1517*a* and the filtered signal 1517*b*. The raw position signal may identify the orientation of the ring magnet 1420 relative to the sensor 1300, and it may be indicative of angular displacement and/or rotational speed of the ring magnet 1420 (and/or the rotating shaft 1430). In some implementations, the raw position signal may be calculated in accordance with Equation 10 below:

$$S_{raw} = \arctan\left(\frac{signal_{1517a}}{signal_{1517b}}\right) \quad \text{(Eq. 10)}$$

where $S_{raw}$ is the raw position signal, $signal_{1517a}$ is signal 1517*a*, and $signal_{1517b}$ is signal 1517*b*.

The error correction module 1524 may include any suitable type of processing circuitry for adjusting the gain and/or offset of the raw position signal that is produced by the CORDIC module 1522. In operation, the error correction module 1524 may receive the raw position signal from the CORDIC module 1522 and generate an adjusted signal based on the received raw position signal. The adjusted signal may be generated by adjusting the gain and/or offset of the raw position signal. The gain and/or offset of the raw position signal may be adjusted, in a well-known fashion, based on a signal 1533 that is generated by a temperature sensor 1532. Additionally or alternatively, the angle gain and/or offset of the raw position signal may be adjusted based on a signal 1570 that is generated by a trim module 1534. The trim module 1534 may be a memory that is arranged to provide (to the error correction module) one or more coefficients for adjusting the gain and/or offset of the raw position signal. However, alternative implementations are possible in which the trim module 1534 includes another type of device (e.g., a humidity sensor, etc.) that is used for correcting the gain and/or offset of the raw position signal. Stated succinctly, the present disclosure is not limited to any specific method for adjusting the gain and/or offset of the raw position signal.

The output module 1526 may include any suitable type of communications interface for outputting the adjusted signal that is produced by the error correction module 1524. The output module may format the adjusted signal into a desired output signal format and provide the formatted signal to another device (e.g., an Engine Control Unit) that is coupled to the output module 1526. The desired format may be PWM format, Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format to name a few non-limiting examples.

FIG. 15 is provided in the context of the implementation of the sensor 1300 that is shown in FIG. 13A, in which the sensor 1300 is provided with four pairs of sensing elements. In the example of FIG. 15, the signal $S_{raw}$ is generated by taking the arctan of the quotient of signals 1517*a* and 1517*b*, where signals 1517*a* and 1517*b* are generated in accordance with equations 11 and 12 below:

$$signal_{1517a} = (signal_{1501a} - signal_{1501d}) - (signal_{1501b} + signal_{1501c}) \quad (11)$$

$$signal_{1517b} = (signal_{1503a} + signal_{1503d}) - (signal_{1503b} + signal_{1503c}) \quad (12)$$

where $signal_{1501a}$ is the signal output from the vertical Hall element 1304A, $signal_{1501b}$ is the signal output from the vertical Hall element 1304B, $signal_{1501c}$ is the signal output from the vertical Hall element 1304C, $signal_{1501d}$ is the signal output from the vertical Hall element 1304D, $signal_{1503a}$ is the signal output from the vertical Hall element 1302A, $signal_{1503b}$ is the signal output from the vertical Hall element 1302B, $signal_{1503c}$ is the signal output from the vertical Hall element 1302C, $signal_{1503d}$ is the signal output from the vertical Hall element 1302D. The signals 1517*a* and 1517*b*, which are generated in accordance with Equations 11 and 12, may be used to generate the signal Sraw, as discussed above with respect to Equation 10. As can be readily appreciated, equations 11-12 are provided for illustrative purposes only, and they do not reflect demodulation, amplification, filtering, and/or any other signal processing that might be performed.

FIG. 15 is provided to illustrate one possible example of processing circuitry for the implementation of the sensor 1300, which is shown in FIG. 13A. In this regard, it will be understood that the present disclosure is not limited to any specific type of processing circuitry being used in the sensor 1300. For example, in some implementations, the number of modulators in each of the processing paths 1502*a-b* may be reduced from 4 to 2 by first subtracting the signals produced by each of the vertical Hall element pairs [1304A, 1304D], [1304B, 1304C], [1302A, 1302D], and [1302B, 1302C], and then demodulating the differences.

Figure 16:
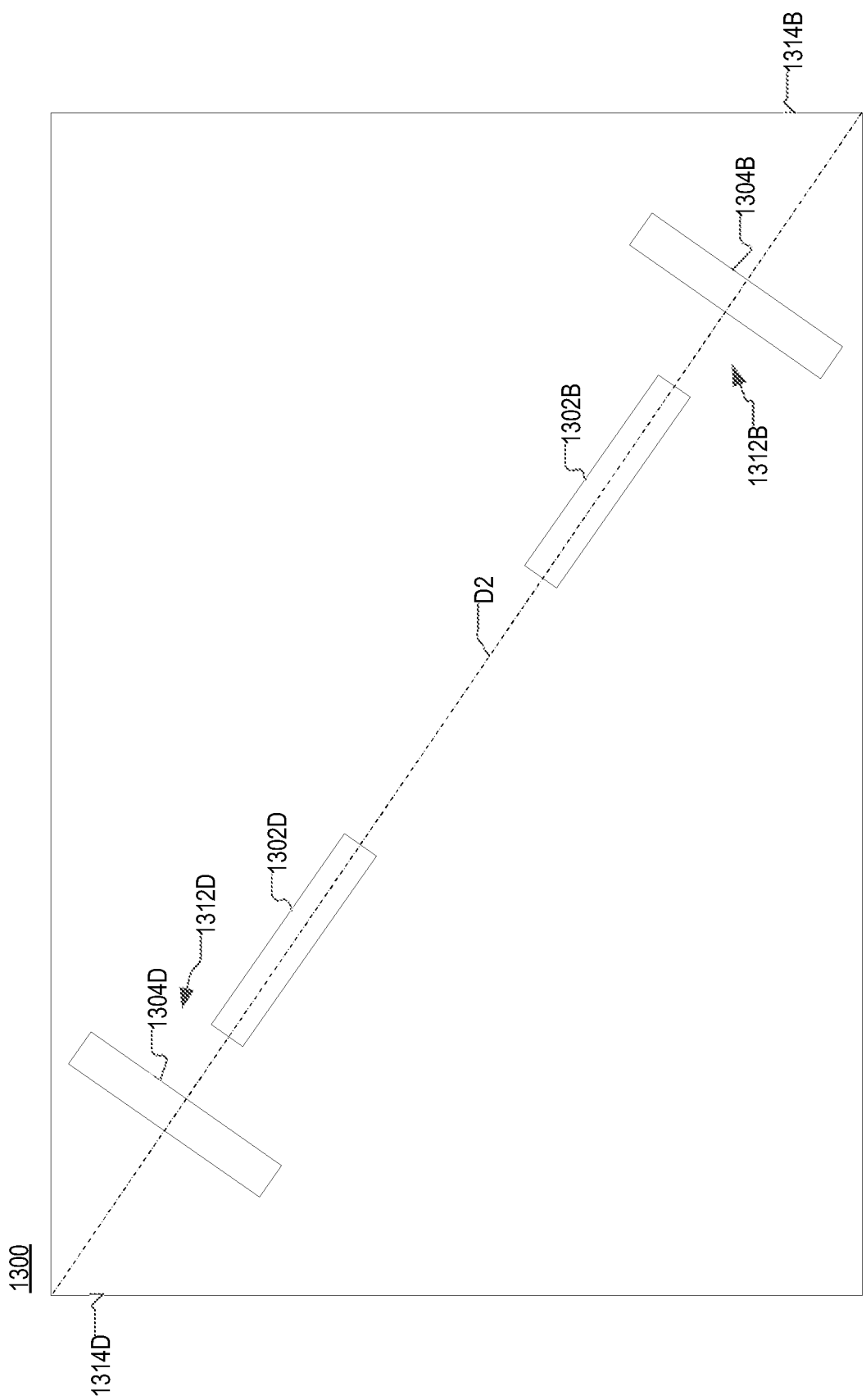
FIG. 16 is a top-down view of an example of a sensor, according to aspects of the disclosure.

FIG. 16 is a diagram of another implementation of the sensor 1300, according to aspects of the disclosure. As illustrated, in the example of FIG. 16, the sensor 1300 includes vertical Hall elements 1302B, 1302D, 1304B, and 1304D. The vertical Hall elements 1302B, 1302D, 1304B, and 1304D may be arranged in the manner discussed above with respect to FIG. 13A. FIG. 16 is provided to illustrate that the present disclosure is not limited to including any number of vertical Hall element pairs and that some of the vertical Hall element pairs shown in FIG. 13A can be omitted.

Figure 17:
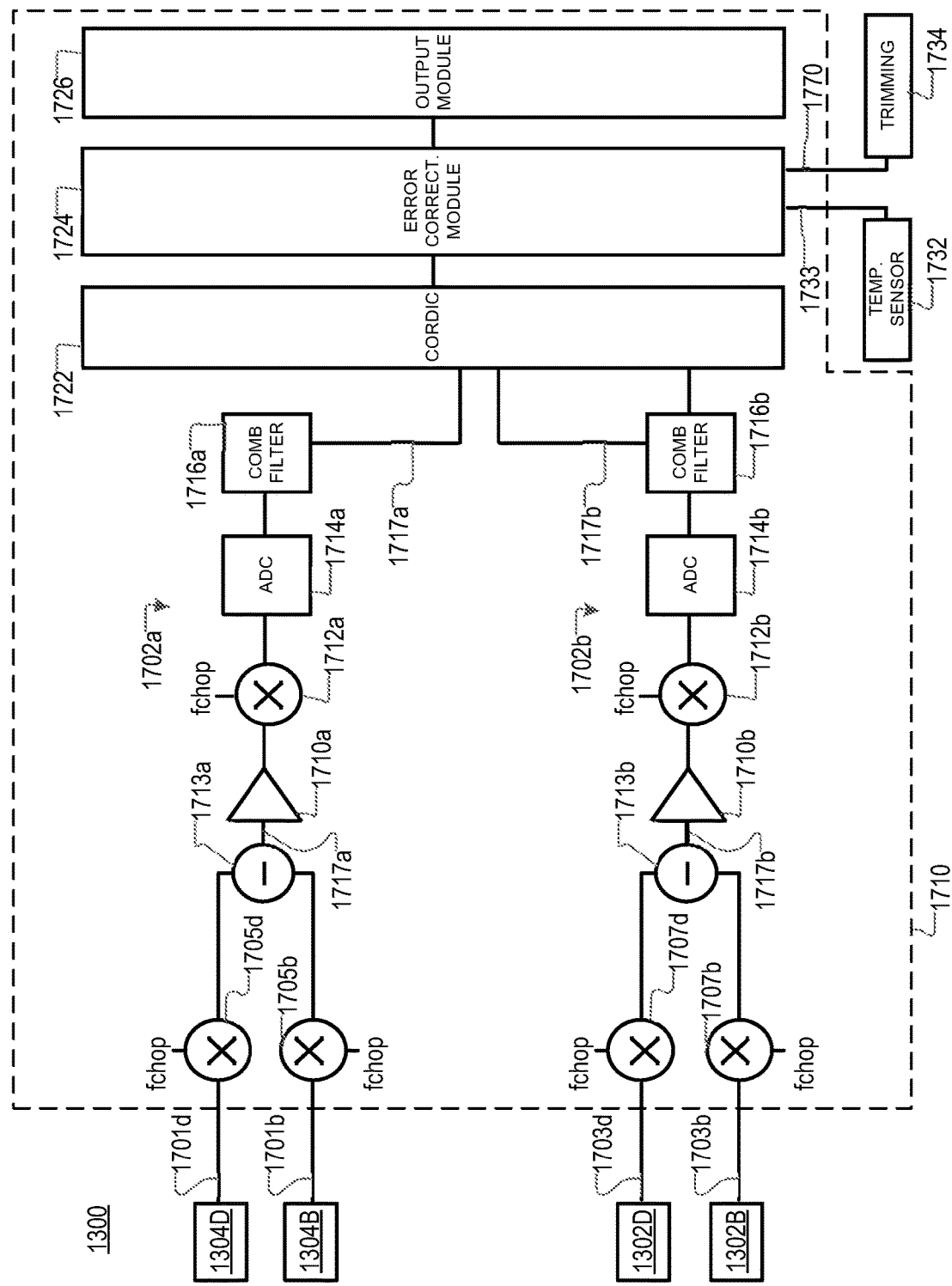
FIG. 17 is a circuit diagram of the sensor of FIG. 16, according to aspects of the disclosure.

FIG. 17 is a circuit diagram of a processing circuitry 1710 that can be used in the implementation of the sensor 1300 that is shown in FIG. 16. FIG. 17 is provided to illustrate one possible example of processing circuitry for the implementation of the sensor 1300, which is shown in FIG. 16. In this regard, it will be understood that the present disclosure is not limited to any specific arrangement of the processing circuitry of sensor 1300.

The processing circuitry 1710 may include a processing path 1702*b* and a processing path 1702*b*. The processing path 1702*a* may be arranged to process signals that are generated by the vertical Hall elements 1304B and 1304D and the processing path 1702*b* may be arranged to process signals that are generated by the vertical Hall elements 1302B and 1302D.

Processing path 1702*a* may include vertical Hall elements 1304B and 1304D, demodulators 1705*b* and 1705*d*, a subtraction element 1713*a*, an amplifier 1710*a*, a modulator 1712*a*, an analog to digital converter (ADC) 1714*a*, and a comb filter 1716*a*. Vertical Hall element 1304D may generate a signal 1701*d*, which is subsequently modulated by the modulator 1705*d*. Vertical Hall element 1304B may generate a signal 1701*b*, which is subsequently modulated by the modulator 1705*b*. The demodulation of each of signals 1701*d* and 1701*b* may be performed based on a chopping frequency fchop. After the signals 1701*d* and 1701*b* are demodulated, modulated signal 1701*b* may be subtracted from modulated signal 1701*d* to produce a signal 1717*a*. The subtraction may be performed by using the subtraction element 1713*a*. The amplifier 1710*a* may amplify the signal 1717*a*. The modulator 1712*a* may modulate the amplified signal 1717*a* based on the chopping frequency fchop. The ADC 1714*a* may digitize the modulated signal 1717*a*. The comb filter 1716*a* may filter the digitized signal 1717*a*.

Processing path 1702*b* may include vertical Hall elements 1302B and 1302D, demodulators 1707*b* and 1707*d*, a subtraction element 1713*b*, an amplifier 1710*b*, a modulator 1712*b*, an analog-to-digital converter 1714*b*, and a comb filter 1716*b*. Vertical Hall element 1302D may generate a signal 1703*d*, which is subsequently modulated by the modulator 1707*d*. Vertical Hall element 1302B may generate a signal 1703*b*, which is subsequently modulated by the modulator 1707*b*. The demodulation of each of signals 1703*b* and 1703*d* may be performed based on the chopping frequency fchop. After the signals 1703*b* and 1703*d* are demodulated, modulated signal 1703*b* may be subtracted from modulated signal 1703*d* to produce a signal 1717*b*. The subtraction may be performed by using subtraction element 1713*b*. The amplifier 1710*b* may amplify the signal 1717*b*. The modulator 1712*b* may modulate the signal 1717*b* based on the chopping frequency fchop. The ADC 1714*b* may digitize the modulated signal 1717*b*. The comb filter 1716*b* may filter the digitized signal 1717*b*.

The CORDIC module 1722 may include any suitable type of processing circuitry that is configured to execute a Coordinate Rotation Digital Computer (CORDIC) algorithm or otherwise compute an arctangent function (e.g., such as by using a look-up table). According to the example of FIG. 17, the CORDIC module is configured to calculate a raw position signal based on the filtered signal 1717*a* and the filtered signal 1717*b*. The raw position signal may identify the orientation of the ring magnet 1420 relative to the sensor 1300, and it may be indicative of angular displacement and/or rotational speed of the ring magnet 1420 (and/or the rotating shaft 1430). In some implementations, the raw position signal may be calculated in accordance with Equation 13 below:

$$S_{raw} = \arctan\left(\frac{\text{signal}_{1717a}}{\text{signal}_{1717b}}\right) \quad \text{(Eq. 13)}$$

where $S_{raw}$ is the raw position signal, $\text{signal}_{1717a}$ is signal 1717*a*, and $\text{signal}_{1771b}$ is signal 1717*b*.

The error correction module 1724 may include any suitable type of processing circuitry for adjusting the gain and/or offset of the raw position signal that is produced by the CORDIC module 1722. In operation, the error correction module 1724 may receive the raw position signal from the CORDIC module 1722 and generate an adjusted signal based on the received raw position signal. The adjusted signal may be generated by adjusting the gain and/or offset of the raw position signal. The gain and/or offset of the raw position signal may be adjusted, in a well-known fashion, based on a signal 1733 that is generated by a temperature sensor 1732. Additionally or alternatively, the gain and/or offset of the raw position signal may be adjusted based on a signal 1770 that is generated by a trim module 1734. The trim module 1734 may be a memory that is arranged to provide (to the error correction module) one or more coefficients for adjusting the gain and/or offset of the raw position signal. However, alternative implementations are possible in which the trim module 1734 includes another type of device (e.g., a humidity sensor, etc.) that is used for correcting the gain and/or offset of the raw position signal. Stated succinctly, the present disclosure is not limited to any specific method for adjusting the gain and/or offset of the raw position signal.

The output module 1726 may include any suitable type of communications interface for outputting the adjusted signal that is produced by the error correction module 1724. The output block may format the adjusted signal into a desired output signal format and provide the formatted signal to another device (e.g., an Engine Control Unit) that is coupled to the output module 1726. The desired format may be PWM format, Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format to name a few non-limiting examples.

FIG. 17 is provided in the context of the implementation of the sensor 1300 that is shown in FIG. 16, in which the sensor 1300 is provided with two pairs of sensing elements, instead of four. In the example of FIG. 17, the signal $S_{raw}$ is generated by taking the arctan of the quotient of signals 1717*a* and 1717*b*, where signals 1717*a* and 1717*b* are generated in accordance with equations 14 and 15 below:

$$\text{signal}_{1717} == \text{signal}_{1701d} - \text{signal}_{1701b} \quad (14)$$

$$\text{signal}_{1717b} = \text{signal}_{1703d} - \text{signal}_{1703b} \quad (15)$$

where $\text{signal}_{1701d}$ is the signal output from the vertical Hall element 1304D, $\text{signal}_{1701b}$ is the signal output from the vertical Hall element 1304B, $\text{signal}_{1703d}$ is the signal output from the vertical Hall element 1302D, and $\text{signal}_{1703b}$ is the signal output from the vertical Hall element 1302B. The signals 1717*a* and 1717*b*, which are generated in accordance with Equations 14 and 15, may be used to generate the signal Sraw, as discussed above with respect to Equation 13. As can be readily appreciated, equations 14-15 are provided for illustrative purposes only, and they do not reflect demodulation, amplification, filtering, and/or any other signal processing that might performed.

The processes described herein may be implemented in hardware, software, or a combination of the two. The processes described herein may be implemented in computer programs executed on programmable computers/machines that each includes a processor, a non-transitory machine-readable medium or another article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A sensor, comprising:
a substrate having a reference crystal orientation; and
a plurality of vertical Hall element pairs that are formed on the substrate, each vertical Hall element pair including: (i) a respective first vertical Hall element that is oriented at a respective first angle relative to the reference crystal orientation of the substrate and (ii) a respective second vertical Hall element that is oriented at a respective second angle relative to the reference crystal orientation of the substrate,
wherein the substrate has a rectangular shape, and each of the vertical Hall element pairs is disposed in a different respective corner of the substrate,
wherein the respective first vertical Hall element in at least two of the vertical Hall element pairs is oriented at substantially +45 degrees relative to the reference crystal orientation of the substrate, and the respective second vertical Hall element in at least two of the vertical Hall element pairs is oriented at substantially −45 degrees relative to the reference crystal orientation of the substrate.

2. The sensor of claim 1, wherein;
the vertical Hall elements in each of the vertical Hall element pairs have axes of maximum sensitivity that are substantially perpendicular to each other,
one of the vertical Hall elements in each of the vertical Hall element pairs has an axis of maximum sensitivity that is substantially parallel with a given diagonal of the substrate, and the other one of the vertical Hall elements in each of the vertical Hall element pairs has an axis of maximum sensitivity that is substantially perpendicular to the given diagonal of the substrate.

3. The sensor of claim 1, wherein:
the respective first vertical Hall element in each of the vertical Hall element pairs is configured to face towards the vertical Hall element pair's respective corner, and
the respective second vertical Hall element in each of the vertical Hall element pairs is configured to face away from the vertical Hall element pair's respective corner.

4. The sensor of claim 1, wherein:
one of the vertical Hall elements in each of the vertical Hall element pairs has an axis of maximum sensitivity that is substantially parallel with a given diagonal of the substrate, and
the other one of the vertical Hall elements in each of the vertical Hall element pairs has an axis of maximum sensitivity that is substantially perpendicular to the given diagonal of the substrate.

5. The sensor of claim 1, wherein the plurality of vertical Hall element pairs includes at least two vertical Hall element pairs.

6. The sensor of claim 1, further comprising a processing circuitry configured to:
receive a plurality of signals, each of the signals being generated by a different respective vertical Hall element in any of the plurality of vertical Hall element pairs, each of the signals being generated in response to a magnetic field that is associated with a rotating target; and
generate an output signal that is indicative of at least one of speed or position of the rotating target.

7. The sensor of claim 1, wherein the substrate includes a silicon die.

8. A sensor, comprising:
a substrate having a reference crystal orientation; and
a plurality of vertical Hall element pairs that are formed on the substrate, each vertical Hall element pair including: (i) a respective first vertical Hall element that is oriented at a respective first angle relative to the reference crystal orientation of substrate and (ii) a respective second vertical Hall element that is oriented at a respective second angle relative to the reference crystal orientation of the substrate,
wherein the substrate has a rectangular shape, and each of the vertical Hall element pairs is disposed in a different respective corner of the substrate,
wherein the plurality of vertical Hall elements includes a first vertical Hall element pair, a second vertical Hall element pair, a third vertical Hall element pair, and a fourth vertical Hall element pair, the sensor further comprising processing circuitry configured to generate a differential signal having a first component and a second component, the first component and the second component being defined as follows:

firstComponent=$S_{1,1}-S_{4,1}+S_{2,1}-S_{3,1}$ secondComponent=$S_{1,2}-S_{4,2}+S_{2,2}-S_{3,2}$ where $S_{1,1}$ is a signal that is output by the respective first vertical Hall element of the first vertical Hall element pair, $S_{4,1}$ is a signal that is output by the respective first vertical Hall element of the fourth vertical Hall element pair, $S_{2,1}$ is a signal that is output by the respective first vertical Hall element of the second vertical Hall element pair, $S_{3,1}$ is a signal that is output by the respective first vertical Hall element of the third vertical Hall element pair, $S_{1,2}$ is a signal that is output by the respective second vertical Hall element of the first vertical Hall element pair, $S_{4,2}$ is a signal that is output by the respective second vertical Hall element of the fourth vertical Hall element pair, $S_{2,2}$ is a signal that is output by the respective second vertical Hall element of the second vertical Hall element pair, and $S_{3,2}$ is a signal that is output by the respective second vertical Hall element of the third vertical Hall element pair.

9. The sensor of claim 8, wherein each of the signals $S_{1,1}$, $S_{4,1}$, $S_{2,1}$, $S_{3,1}$, $S_{1,2}$, $S_{4,2}$, $S_{2,2}$, $S_{3,2}$ is generated in response to a magnetic field associated with a rotating target, and the processing circuitry is configured to generate an output signal based on the differential signal, the output signal being indicative of at least one of speed or position of the rotating target.

10. A sensor, comprising:
a substrate having a rectangular shape;
a plurality of vertical Hall element pairs that are formed on the substrate, each of the vertical Hall element pairs being formed in a different corner of the substrate, each of the vertical Hall element pairs including: (i) a respective first vertical Hall element that is configured to face the vertical Hall element pair's respective corner, and (ii) a respective second vertical Hall element that is configured to face away from the vertical Hall element pair's respective corner,
wherein the substrate has a reference crystal orientation, the respective first vertical Hall element in at least two of the vertical Hall element pairs is oriented at substantially +45 degrees relative to the reference crystal orientation of the substrate, and the respective second vertical Hall element in at least two of the vertical Hall element pairs is oriented at substantially −45 degrees relative to the reference crystal orientation of the substrate.

11. The sensor of claim 10, wherein:
the vertical Hall elements in each of the vertical Hall element pairs have axes of maximum sensitivity that are substantially perpendicular to each other,
one of the vertical Hall elements in each of the vertical Hall element pairs has an axis of maximum sensitivity that is substantially parallel with a given diagonal of the substrate, and the other one of the vertical Hall elements in each of the vertical Hall element pairs has an axis of maximum sensitivity that is substantially perpendicular to the given diagonal of the substrate.

12. The sensor of claim 10, wherein:
the substrate has a reference crystal orientation,
the respective first vertical Hall element in each of the vertical Hall element pairs is oriented at a respective first angle relative to the reference crystal orientation of the substrate, and
the respective second vertical Hall element in each of the vertical Hall element pairs is oriented at a respective second angle relative to the reference crystal orientation of the substrate.

13. The sensor of claim 10, wherein:
one of the vertical Hall elements in each of the vertical Hall element pairs has an axis of maximum sensitivity that is substantially parallel with a given diagonal of the substrate, and
the other one of the vertical Hall elements in each of the vertical Hall element pairs has an axis of maximum sensitivity that is substantially perpendicular to the given diagonal of the substrate.

14. The sensor of claim 10, wherein the plurality of vertical Hall element pairs includes at least two vertical Hall element pairs.

15. A sensor, comprising:
a substrate having a rectangular shape:
a plurality of vertical Hall element pairs that are formed on the substrate, each of the vertical Hall element pairs being formed in a different corner of the substrate, each of the vertical Hall element pairs including: (i) a respective first vertical Hall element that is configured to face the vertical Hall element pair's respective corner, and (ii) a respective second vertical Hall element that is configured to face away from the vertical Hall element pair's respective corner,
wherein the plurality of vertical Hall elements includes a first vertical Hall element pair, a second vertical Hall element pair, a third vertical Hall element pair, and a fourth vertical Hall element pair, the sensor further comprising processing circuitry configured to generate a differential signal having a first component and a second component, the first component and the second component being defined as follows:

firstComponent=$S_{1,1}-S_{4,1}+S_{2,1}-S_{3,1}$ secondComponent=$S_{1,2}-S_{4,2}+S_{2,2}-S_{3,2}$ where $S_{1,1}$ is a signal that is output by the respective first vertical Hall element of the first vertical Hall element pair, $S_{4,1}$ is a signal that is output by the respective first vertical Hall element of the fourth vertical Hall element pair, $S_{2,1}$ is a signal that is output by the respective first vertical Hall element of the second vertical Hall element pair, $S_{3,1}$ is a signal that is output by the respective first vertical Hall element of the third vertical Hall element pair, $S_{1,2}$ is a signal that is output by the respective second vertical Hall element of the first vertical Hall element pair, $S_{4,2}$ is a signal that is output by the respective second vertical Hall element of the fourth vertical Hall element pair, $S_{2,2}$ is a signal that is output by the respective second vertical Hall element of the second vertical Hall element pair, and $S_{3,2}$ is a signal that is output by the respective second vertical Hall element of the third vertical Hall element pair.

16. The sensor of claim 15, wherein each of the signals $S_{1,1}$, $S_{4,1}$, $S_{2,1}$, $S_{3,1}$, $S_{1,2}$, $S_{4,2}$, $S_{2,2}$, $S_{3,2}$ is generated in response to a magnetic field associated with a rotating target, and the processing circuitry is configured to generate an output signal based on the differential signal, the output signal being indicative of at least one of speed or position of the rotating target.

17. The sensor of claim 10, further comprising a processing circuitry configured to:
receive a plurality of signals, each of the signals being generated by a different respective vertical Hall element in any of the plurality of vertical Hall element pairs, each of the signals being generated in response to a magnetic field that is associated with a rotating target; and generate an output signal that is indicative of at least one of speed or position of the rotating target.

18. A system, comprising:
a ring magnet having first surface, a second surface, and a bore extending from the first surface to the second surface, the bore having a central longitudinal axis;
a substrate having a reference crystal orientation;
a plurality of vertical Hall element pairs that are formed on the substrate, each vertical Hall element pair including: (i) a respective first vertical Hall element that is oriented at a respective first angle relative to the reference crystal orientation of the substrate and (ii) a respective second vertical Hall element that is oriented at a respective second angle relative to the reference crystal orientation of the substrate,
wherein the respective first vertical Hall element in at least two of the vertical Hall element pairs is often at substantially +45 degrees relative to the reference crystal orientation of the substrate, and the respective second vertical Hall element in at least two of the vertical Hall element pairs is oriented at substantially −45 degrees relative to the reference crystal orientation of the substrate.

19. The system of claim 18, wherein the substrate is inserted into the bore of the ring magnet.

20. The system of claim 18, wherein the vertical Hall elements in each of the vertical Hall element pairs have axes of maximum sensitivity that are substantially perpendicular to each other.

21. The system of claim 18, wherein:
the substrate has a rectangular shape;
each of the vertical Hall element pairs is disposed in a different respective corner of the substrate,
the respective first vertical Hall element in each of the vertical Hall element pairs is configured to face towards the vertical Hall element pair's respective corner, and
the respective second vertical Hall element in each of the vertical Hall element pairs is configured to face away from the vertical Hall element pair's respective corner.

22. The system of claim 18, further comprising a processing circuitry configured to:
receive a plurality of signals, each of the signals being generated by a different respective vertical Hall element in any of the plurality of vertical Hall element pairs, each of the signals being generated in response to a magnetic field that is associated with a rotating target; and generate an output signal that is indicative of at least one of speed or position of the rotating target.

23. A system, comprising:
a ring magnet having first surface, a second surface, and a bore extending from the first surface to the second surface, the bore having a central longitudinal axis,
a substrate having a reference crystal orientation;
a plurality of vertical Hall element pairs that are formed on the substrate, each vertical Hall element pair including: (i) a respective first vertical Hall element that is oriented at a respective first angle relative to the reference crystal orientation of the substrate and (ii) a respective second vertical Hall element that is oriented at a respective second angle relative to the reference crystal orientation of the substrate,
wherein the plurality of vertical Hall elements includes a first vertical Hall element pair, a second vertical Hall element pair, a third vertical Hall element pair, and a fourth vertical Hall element pair, the system further comprising processing circuitry configured to generate a differential signal having a first component and a second component, the first component and the second component being defined as follows:

firstComponent=$S_{1,1}-S_{4,1}+S_{2,1}-S_{3,1}$ secondComponent=$S_{1,2}-S_{4,2}+S_{2,2}-S_{3,2}$ where $S_{1,1}$ is a signal that is output by the respective first vertical Hall element of the first vertical Hall element pair, $S_{4,1}$ is a signal that is output by the respective first vertical Hall element of the fourth vertical Hall element pair, $S_{2,1}$ is a signal that is output by the respective first vertical Hall element of the second vertical Hall element pair, $S_{3,1}$ is a signal that is output by the respective first vertical Hall element of the third vertical Hall element pair, $S_{1,2}$ is a signal that is output by the respective second vertical Hall element of the first vertical Hall element pair, $S_{4,2}$ is a signal that is output by the respective second vertical Hall element of the fourth vertical Hall element pair, $S_{2,2}$ is a signal that is output by the respective second vertical Hall element of the second vertical Hall element pair, and $S_{3,2}$ is a signal that is output by the respective second vertical Hall element of the third vertical Hall element pair.

24. The system of claim 23, wherein each of the signals $S_{1,1}$, $S_{4,1}$, $S_{2,1}$, $S_{3,1}$, $S_{1,2}$, $S_{4,2}$, $S_{2,2}$, $S_{3,2}$ is generated in response to a magnetic field associated with a rotating target, and the processing circuitry is configured to generate an output signal based on the differential signal, the output signal being indicative of at least one of speed or position of the rotating target.

* * * * *